United States Patent [19]
Tanaka et al.

[11] Patent Number: 5,978,958
[45] Date of Patent: Nov. 2, 1999

[54] DATA TRANSMISSION SYSTEM, DATA RECORDING AND REPRODUCING APPARATUS AND RECORDING MEDIUM EACH HAVING DATA STRUCTURE OF ERROR CORRECTING CODE

[75] Inventors: Shin-ichi Tanaka, Kyoto; Masatoshi Shimbo, Mino; Shinya Yamada, Osaka; Tadashi Kojima; Koichi Hirayama, both of Yokohama, all of Japan

[73] Assignees: Matsushita Electric Industrial Co., Ltd., Osaka; Kabushiki Kaisha Toshiba, Kanagawa, both of Japan

[21] Appl. No.: 08/901,527

[22] Filed: Jul. 28, 1997

Related U.S. Application Data

[63] Continuation-in-part of application No. 08/626,547, Apr. 2, 1996, abandoned.

[30] Foreign Application Priority Data

Apr. 3, 1995 [JP] Japan ..................................... 7-077976

[51] Int. Cl.[6] ............................ G06F 11/00; H03M 13/00
[52] U.S. Cl. ........................... 714/804; 714/758; 714/766
[58] Field of Search ................................ 371/50.1, 49.1, 371/48, 37.7, 37.1, 37.2, 37.5, 40.4, 35, 20.1; 369/275.3; 364/944.5, 265, 265.1, 265.2, 266; 714/804, 800, 799, 758, 752, 753, 755, 756, 766, 751, 712

[56] References Cited

U.S. PATENT DOCUMENTS

| | | | |
|---|---|---|---|
| 4,323,931 | 4/1982 | Jacoby | 360/40 |
| 4,501,000 | 2/1985 | Immink et al. | 375/25 |
| 4,703,494 | 10/1987 | Ozaki et al. | 371/19 |
| 4,728,929 | 3/1988 | Tanaka | 340/347 |
| 4,791,643 | 12/1988 | Molstad et al. | 371/40 |
| 4,885,750 | 12/1989 | Tanaka et al. | 371/37.4 |
| 4,907,215 | 3/1990 | Sako et al. | 369/59 |
| 4,953,168 | 8/1990 | Odaka | 371/37.4 |
| 5,151,905 | 9/1992 | Yokono et al. | 371/39.1 |
| 5,276,674 | 1/1994 | Tanaka | 369/275.3 |
| 5,546,409 | 8/1996 | Karasawa | 371/37.4 |

FOREIGN PATENT DOCUMENTS

| | | |
|---|---|---|
| 258059 | 3/1988 | European Pat. Off. . |
| 273676 | 7/1988 | European Pat. Off. . |
| 364229 | 4/1990 | European Pat. Off. . |
| 6356610 | 5/1983 | Japan . |
| 60-143486 | 7/1985 | Japan . |
| 60-154371 | 8/1985 | Japan . |
| 2201067 | 8/1988 | United Kingdom . |

OTHER PUBLICATIONS

"Sequence–state Methods for Run–length–limited Coding", by P.A. Franaszek, published on pp. 376–383 of IBM J. Res. Develop. In Jul, 1970.

Copy of a PCT International Search Report in Application No. PCT/JP 96/00876.

Primary Examiner—Trinh L. Tu
Attorney, Agent, or Firm—Greenblum & Berstein P.L.C.

[57] ABSTRACT

A data transmission system for transmitting information data with a parity of an error correcting code for correcting an error in the information data. A read-out controller controls a transmitter to transmit information data and a parity so that each data component of the information data obtained by dividing the information data of one data block area into a plurality of data components and each parity component of the parity obtained by dividing the parity of one block area into a plurality of parity components are transmitted at intervals of each sector having a sector address. The sector is defined as an data area obtained by dividing one data block area of a predetermined data amount into a plurality of sectors each having an identical data amount.

7 Claims, 19 Drawing Sheets

EDC : Error Detection Code for Header 20 and Data 1a, 1b to 12a, 12b

IEC 62 : Error Correction Code for Sector Address 61

Fig.11 Data Receiver 2000

DATA TRANSMISSION SYSTEM, DATA RECORDING AND REPRODUCING APPARATUS AND RECORDING MEDIUM EACH HAVING DATA STRUCTURE OF ERROR CORRECTING CODE

CROSS REFERENCE TO RELATED APPLICATIONS

The present application is a continuation-in-part of pending U.S. patent application Ser. No. 08/626,547, filed on Apr. 2, 1996, now abandoned, in the name of S. TANAKA et al. entitled "Data Transmission System, Data Recording And Reproducing Apparatus And Recording Medium Each Having Data Structure Of Error Correcting Code". The disclosure of U.S. patent application Ser. No. 08/626,547 is expressly incorporated by reference, in its entirety, herein.

BACKGROUND OF THE INVENTION

1. Field of the Invention

The present invention relates to a data transmission system, a data recording and reproducing apparatus, and a recording medium each having a data structure of error correcting code, a data structure for use in a recording medium, a method for arranging a parity of an error correction code, a method for transmitting information data, a method for receiving information data, a method for recording information data in a recording medium, and a method for reproducing information data from a recording medium.

In particular, the present invention relates to a data transmission system for transmitting data through a communication line, a data recording and reproducing apparatus for recording data into a recording medium and reproducing data from the recording medium, and a recording medium such as an optical disk, a magneto-optical disk, a magnetic disk, a compact disk, a magnetic tape, a semiconductor memory, or the like, each of the data transmission system, the data recording and reproducing apparatus, and the recording medium having a data structure of error correcting code, a data structure for use in a recording medium, a method for arranging a parity of an error correcting code, a method for transmitting information data, a method for receiving information data, a method for recording information data in a recording medium, and a method for reproducing information data from a recording medium.

2. Description of the Prior Art

When transmitting and recording a great amount of digital data, an error correcting code (referred to as an ECC hereinafter) is widely used for the purpose of improving the reliability of the data.

The ECC word generated by attaching a parity to an original data, and then, the redundancy of the data having the parity increases, however, the ECC has the capabilities of detecting and correcting errors generated in the process of transmitting, recording and reproducing the data.

In general, the ECC has a higher error correcting capability when the ECC word has an increased redundancy, i.e., when the ECC word includes a greater amount of parity symbols. Therefore, the ECC word includes a plurality of parity symbols or bytes.

Conventionally, when ECC encoding a great amount of data upon transmitting or recording the data, the data is previously divided into a plurality of blocks each having a predetermined length, and a parity is attached to each block. Then, the parity is arranged at the tail of the block to be corrected, generally. That is, in the conventional process of data transmission, the data has been transmitted with the parity added to the tail of each data block. On the other hand, in the data recording process, the parity has been recorded in a position adjacent to each data block.

An arrangement of the data and the parity of the ECC word in the conventional data recording method is concretely shown in FIG. 1.

FIG. 1 shows a logical data format of one block of an optical disk in which data and a parity are recorded by a prior art method for arranging the parity of the ECC.

The block is divided into a data area 90, a row parity area 54, and a column parity area 53, depending on the type of information data recorded. In the present case, the parity is a part of the ECC word. As is apparent from FIG. 1, the row parity area 54 and the column parity area 53 are partially overlapped with each other.

One block is comprised of 156 data frames 51 and 12 parity frames. In the present case, the frame 51 means a group of data or parities corresponding to one row of each block, and constructs an ECC word in the row direction.

Each data frame 51 is comprised of data of 158 bytes and a row parity of 10 symbols each of which consists of one byte (referred to as a C1 parity hereinafter) for error correction of the data. Then, thirteen data frames constitute one sector 52. Therefore, one block is comprised of twelve sectors 52 in this case. At the head of each sector 52 is written a physical sector address 50 of each sector 52 (referred to as a sector address hereinafter). Further, it is noted that a synchronous (Sync) pattern (not shown) is generally added to the head of each frame.

In the column parity 53, twelve bytes in the direction of column constitute one parity (referred to as a C2 parity hereinafter), and the parity is used for correcting an error of the 156-byte data series located upward in an identical column. The above-mentioned 156-byte data and 12-byte parity construct an ECC word in the column direction. FIG. 1 shows a logical format of one block, and the block is physically written continuously in a sequence from the frame located in the uppermost position of the block onto a track of an optical disk in a manner as shown in FIG. 2. Therefore, paying attention to the data series in the direction of column, data are discretely arranged on the disk, and this arrangement is referred to as an interleave.

Thus, conventionally, in both of (a) the data arrangement in the direction of row, i.e., the data series which is not interleaved and (b) the data arrangement in the direction of column, i.e., the data series which is interleaved, the data area 90 in which data is arranged and the parity area 91 in which the parity is arranged have been clearly distinguished from each other.

However, according to the recent trend of increasing the storage capacities and reducing the access times of optical disks, upon reading out data from any optical disk in which the data have been written by the prior art arrangement method, there have been such problems as follows.

Attention is now paid to timings for detecting sector addresses upon continuously reading out information along a track. FIG. 3 shows the timings for the above operation. In this case, the information data is sequentially read out from the frame located in the uppermost position of the block shown in FIG. 1, and therefore, the twelve sector addresses are detected at a predetermined regular time interval. However, since the twelve column parity frames of the column parity 53 are subsequently read out, and therefore, a certain time interval continues for which no sector address is detected continues. Thereafter, the next block is read out, and then, the similar phenomenon occurs repetitively.

Thus, according to the conventional method for arranging the parity of the ECC, the timings for detecting the sector addresses becomes irregular. Therefore, upon retrieving a desired sector address, a complicated control circuit and a complicated calculator circuit are necessary, and this leads to a cause of retarding the time of reading-out. In this case, for example, by providing only the row parity without adding the column parity itself, the timings for detecting the sector addresses can be made regular. However, with only the row parity, the data correcting capability is reduced to impair the reliability of the recorded data.

SUMMARY OF THE INVENTION

A first object of the present invention is therefore to provide a data transmission system comprising a data transmitter and a data receiver, said system being capable of regularly transmitting information data in a data area, and regularly receiving the information data arranged regularly in the data area without impairing the reliability of the transmitted data.

A second object of the present invention is to provide a data recording and reproducing apparatus comprising a data recorder and a data reproducer, said apparatus being capable of regularly recording or writing information data in a data area, and regularly reproducing or reading-out the information data arranged regularly in the data area without impairing the reliability of the recorded data.

A third object of the present invention is to provide a recording medium, in which information data can be regularly recorded or written in a data area, and the recorded information data regularly arranged regularly in the data area can be reproduced or read out without impairing the reliability of the recorded data.

A fourth object of the present invention is to provide a data structure for use in a recording medium, in which information data can be regularly recorded or written in a data area, and the recorded information data regularly arranged regularly in the data area can be reproduced or read out without impairing the reliability of the recorded data.

A fifth object of the present invention is to provide a method for arranging a parity of an ECC, by which information data can be regularly recorded or written in a data area, and the recorded information data regularly arranged regularly in the data area can be reproduced or read out without impairing the reliability of the recorded data.

A sixth object of the present invention is to provide a method for transmitting information data, capable of regularly transmitting information data in a data area.

A seventh object of the present invention is to provide a method for receiving information data, capable of regularly receiving information data arranged regularly in the data area without impairing the reliability of the transmitted data.

An eighth object of the present invention is to provide a method for recording information data, capable of regularly recording or writing information data in a data area of a recording medium.

A ninth object of the present invention is to provide a method for reproducing information data, capable of regularly reproducing or reading out information data arranged regularly in the data area of the recording medium without impairing the reliability of the transmitted data.

In order to achieve the above-mentioned objective, according to a first aspect of the present invention, there is provided a data transmission system for transmitting information data with a parity of an error correcting code for correcting an error in the information data, comprising a data transmitter and a data receiver, wherein said data transmitter comprises:

first storage means for storing information data to be transmitted;

second storage means for storing a parity of an error correcting code;

write control means for writing input information data to be transmitted into said first storage means;

parity generating means for generating a parity to form an error correcting code word of an error correcting code for correcting an error of the information data using a predetermined error correcting coding method in response to the information data stored in said first storage means, and writing the parity into said second storage means;

transmitting means for transmitting the information data stored in said first storage means together with the parity stored in said second storage means; and read-out control means for controlling said transmitting means to transmit the information data stored in said first storage means and the parity stored in said second storage means so that each data component of the information data obtained by dividing the information data of one data block area into a plurality of data components and each parity component of the parity obtained by dividing the parity of one block area into a plurality of parity components are transmitted at intervals of each sector having a sector address, said sector being defined as an data area obtained by dividing one data block area of a predetermined data amount into a plurality of sectors each having an identical data amount, wherein data receiver comprises:

receiving means for receiving each data component of the information data and each parity component of the parity which are transmitted at intervals of each sector by said transmitting means;

data extracting means for extracting the information data of one block area by combining a plurality of data components received by said receiving means;

parity extracting means for extracting the parity of one block area by combining a plurality of parity components received by said receiving means; and error correcting means for correcting an error in the information data of one block area extracted by said data extracting means, using a predetermined error correcting decoding method, based on the parity of one block area extracted by said parity extracting means, and outputting an error-corrected information data.

In the above-mentioned data transmission system, the parity preferably includes a row parity and a column parity, and each sector is comprised of a plurality of frames, wherein said read-out control means controls said transmitting means to transmit the row parity at the tail of each frame after each data component, and the column parity in the last frame of each sector.

According to a second aspect of the present invention, there is provided a data transmitter for transmitting information data with a parity of an error correcting code for correcting an error in the information data, comprising:

first storage means for storing information data to be transmitted;

second storage means for storing a parity of an error correcting code;

write control means for writing input information data to be transmitted into said first storage means;

parity generating means for generating a parity to form an error correcting code word of an error correcting code for correcting an error of the information data using a predetermined error correcting coding method in response to the information data stored in said first storage means, and writing the parity into said second storage means;

transmitting means for transmitting the information data stored in said first storage means together with the parity stored in said second storage means; and read-out control means for controlling said transmitting means to transmit the information data stored in said first storage means and the parity stored in said second storage means so that each data component of the information data obtained by dividing the information data of one data block area into a plurality of data components and each parity component of the parity obtained by dividing the parity of one block area into a plurality of parity components are transmitted at intervals of each sector having a sector address, said sector being defined as an data area obtained by dividing one data block area of a predetermined data amount into a plurality of sectors each having an identical data amount.

In the above-mentioned data transmitter, the parity preferably includes a row parity and a column parity, and each sector is comprised of a plurality of frames, wherein said read-out control means controls said transmitting means to transmit the row parity at the tail of each frame after each data component, and the column parity in the last frame of each sector.

According to a third aspect of the present invention, there is provided a data receiver for receiving information data with a parity of an error correcting code for correcting an error in the information data, comprising:

receiving means for receiving each data component of the information data and each parity component of the parity which are transmitted at intervals of each sector;

data extracting means for extracting the information data of one block area by combining a plurality of data components received by said receiving means;

parity extracting means for extracting the parity of one block area by combining a plurality of parity components received by said receiving means; and error correcting means for correcting an error in the information data of one block area extracted by said data extracting means, using a predetermined error correcting decoding method, based on the parity of one block area extracted by said parity extracting means, and outputting an error-corrected information data.

According to a fourth aspect of the present invention, there is provided a data recording and reproducing apparatus for recording information data with a parity of an error correcting code for correcting an error in the information data into a recording medium, and reproducing the information data with the parity from said recording medium, comprising a data recorder and a data reproducer, wherein said data recorder comprises:

first storage means for storing information data to be recorded;

second storage means for storing a parity of an error correcting code;

write control means for writing input information data to be recorded into said first storage means;

parity generating means for generating a parity to form an error correcting code word of an error correcting code for correcting an error of the information data using a predetermined error correcting coding method in response to the information data stored in said first storage means, and writing the parity into said second storage means;

recording means for recording into said recording medium, the information data stored in said first storage means together with the parity stored in said second storage means; and read-out control means for controlling said recording means to record the information data stored in said first storage means and the parity stored in said second storage means so that each data component of the information data obtained by dividing the information data of one data block area into a plurality of data components and each parity component of the parity obtained by dividing the parity of one block area into a plurality of parity components are recorded at intervals of each sector having a sector address, said sector being defined as an data area obtained by dividing one data block area of a predetermined data amount into a plurality of sectors each having an identical data amount, wherein data reproducer comprises:

reproducing means for reproducing each data component of the information data and each parity component of the parity which are recorded at intervals of each sector in said recording medium;

data extracting means for extracting the information data of one block area by combining a plurality of data components reproduced by said reproducing means;

parity extracting means for extracting the parity of one block area by combining a plurality of parity components reproduced by said reproducing means; and error correcting means for correcting an error in the information data of one block area extracted by said data extracting means, using a predetermined error correcting decoding method, based on the parity of one block area extracted by said parity extracting means, and outputting an error-corrected information data.

In the above-mentioned apparatus, the parity preferably includes a row parity and a column parity, and each sector is comprised of a plurality of frames, wherein said read-out control means controls said recording means to record the row parity at the tail of each frame after each data component, and the column parity in the last frame of each sector.

According to a fifth aspect of the present invention, there is provided a data recorder for recording information data with a parity of an error correcting code for correcting an error in the information data into a recording medium, comprising:

first storage means for storing information data to be recorded;

second storage means for storing a parity of an error correcting code;

write control means for writing input information data to be recorded into said first storage means;

parity generating means for generating a parity to form an error correcting word of an error correcting code for correcting an error of the information data using a predetermined error correcting coding method in response to the information data stored in said first storage means, and writing the parity into said second storage means;

recording means for recording into said recording medium, the information data stored in said first storage means together with the parity stored in said second storage means; and read-out control means for controlling said recording means to record the information data stored in said first storage means and the parity stored in said second storage means so that each data component of the information data obtained by dividing the information data of one data block area into a plurality of data components and each parity component of the parity obtained by dividing the parity of one block area into a plurality of parity components are recorded at intervals of each sector having a sector address, said sector being defined as an data area obtained by dividing one data block area of a predetermined data amount into a plurality of sectors each having an identical data amount.

In the above-mentioned data recorder, the parity preferably includes a row parity and a column parity, and each sector is comprised of a plurality of frames, wherein said read-out control means controls said recording means to record the row parity at the tail of each frame after each data component, and the column parity in the last frame of each sector.

According to a sixth aspect of the present invention, there is provided a data reproducer for reproducing information data with a parity of an error correcting code from a recording medium, comprising:

reproducing means for reproducing each data component of the information data and each parity component of the parity which are recorded at intervals of each sector in said recording medium;

data extracting means for extracting the information data of one block area by combining a plurality of data components reproduced by said reproducing means;

parity extracting means for extracting the parity of one block area by combining a plurality of parity components reproduced by said reproducing means; and error correcting means for correcting an error in the information data of one block area extracted by said data extracting means, using a predetermined error correcting decoding method, based on the parity of one block area extracted by said parity extracting means, and outputting an error-corrected information data.

According to a seventh aspect of the present invention, there is provided a recording medium having a data structure of information data and a parity of an error correcting code for correcting an error in the information data, said recording medium being usable by a data reproducer, said recording medium comprising:

data reproducer readable information data; and data reproducer readable parity of an error correcting code, wherein each data component of the information data obtained by dividing the information data of one data block area into a plurality of data components and each parity component of the parity obtained by dividing the parity of one block area into a plurality of parity components are recorded at intervals of each sector having a sector address, said sector being defined as an data area obtained by dividing one data block area of a predetermined data amount into a plurality of sectors each having an identical data amount.

In the above-mentioned recording medium, the parity preferably includes a row parity and a column parity, and each sector is comprised of a plurality of frames, wherein the row parity is recorded at the tail of each frame after each data component, and the column parity is recorded in the last frame of each sector.

According to an eighth aspect of the present invention, there is provided a data structure for use in a recording medium having information data and a parity of an error correcting code for correcting an error in the information data, said recording medium being usable by a data reproducer, said data structure comprising:

data reproducer readable information data; and data reproducer readable parity of an error correcting code, wherein each data component of the information data obtained by dividing the information data of one data block area into a plurality of data components and each parity component of the parity obtained by dividing the parity of one block area into a plurality of parity components are recorded at intervals of each sector having a sector address, said sector being defined as an data area obtained by dividing one data block area of a predetermined data amount into a plurality of sectors each having an identical data amount.

In the above-mentioned data structure, the parity preferably includes a row parity and a column parity, and each sector is comprised of a plurality of frames, wherein the row parity is recorded at the tail of each frame after each data component, and the column parity is recorded in the last frame of each sector.

According to a ninth aspect of the present invention, there is provided a method for arranging a parity of an error correcting code for correcting an error in the information data, in a recording medium, including the following step of:

arranging the information data and the parity so that each data component of the information data obtained by dividing the information data of one data block area into a plurality of data components and each parity component of the parity obtained by dividing the parity of one block area into a plurality of parity components are recorded at intervals of each sector having a sector address, said sector being defined as an data area obtained by dividing one data block area of a predetermined data amount into a plurality of sectors each having an identical data amount.

In the above-mentioned method, the parity preferably includes a row parity and a column parity, and each sector is comprised of a plurality of frames, wherein said arranging step includes the step of arranging the row parity at the tail of each frame after each data component, and the column parity in the last frame of each sector.

According to a tenth aspect of the present invention, there is provided a method for transmitting information data with a parity of an error correcting code for correcting an error in the information data, including the following steps of:

writing input information data to be transmitted into first storage means;

generating a parity to form an error correcting code word of an error correcting code for correcting an error of the information data using a predetermined error correcting coding method in response to the information data stored in said first storage means, and writing the parity into said second storage means;

transmitting the information data stored in said first storage means together with the parity stored in said second storage means; and controlling to transmit the information data stored in said first storage means and the parity stored in said second storage means so that each data component of the information data obtained by dividing the information data of one data block area into a plurality of data components and each parity component of the parity obtained by dividing the parity of one block area into a plurality of parity components are transmitted at intervals of each sector having a sector address, said sector being defined as an data area obtained by dividing one data block area of a predetermined data amount into a plurality of sectors each having an identical data amount.

In the above-mentioned method, the parity preferably includes a row parity and a column parity, and each sector is comprised of a plurality of frames, wherein said controlling step includes the step of controlling to transmit the row parity at the tail of each frame after each data component, and the column parity in the last frame of each sector.

According to an eleventh aspect of the present invention, there is provided a method for receiving information data with a parity of an error correcting code for correcting an error in the information data, including the following steps of:

receiving each data component of the information data and each parity component of the parity which are transmitted at intervals of each sector;

extracting the information data of one block area by combining a plurality of received data components;

extracting the parity of one block area by combining a plurality of received parity components; and correcting an error in the information data of one block area extracted, using a predetermined error correcting decoding method, based on the parity of one block area extracted, and outputting an error-corrected information data.

According to a twelfth aspect of the present invention, there is provided a method for recording information data with a parity of an error correcting code for correcting an error in the information data into a recording medium, including the following steps of:

writing input information data to be recorded into first storage means;

generating a parity to form an error correcting code word of an error correcting code for correcting an error of the information data using a predetermined error correcting coding method in response to the information data stored in said first storage means, and writing the parity into second storage means;

recording into said recording medium, the information data stored in said first storage means together with the parity stored in said second storage means; and controlling to record the information data stored in said first storage means and the parity stored in said second storage means so that each data component of the information data obtained by dividing the information data of one data block area into a plurality of data components and each parity component of the parity obtained by dividing the parity of one block area into a plurality of parity components are recorded at intervals of each sector having a sector address, said sector being defined as an data area obtained by dividing one data block area of a predetermined data amount into a plurality of sectors each having an identical data amount.

In the above-mentioned method, the parity preferably includes a row parity and a column parity, and each sector is comprised of a plurality of frames, wherein said controlling step includes the step of controlling to record the row parity at the tail of each frame after each data component, and the column parity in the last frame of each sector.

According to a thirteenth aspect of the present invention, there is provided a method for reproducing information data with a parity of an error correcting code from a recording medium, including the following steps of:

reproducing each data component of the information data and each parity component of the parity which are recorded at intervals of each sector in said recording medium;

extracting the information data of one block area by combining a plurality of data components reproduced;

extracting the parity of one block area by combining a plurality of parity components reproduced; and correcting an error in the information data of one block area extracted, using a predetermined error correcting decoding method, based on the parity of one block area extracted, and outputting an error-corrected information data.

According to the present invention, a parity is not recorded in a bunched continuous area but recorded dispersedly in each sectors of the areas in which the data to be corrected is recorded. Therefore, the information data arranged regularly in the data area is regularly read out, thereby producing such an advantageous effect that the data reproducing or read-out apparatus is allowed to be simplified and improved for higher operation speed.

Further, according to the present invention, the parity is not solely transmitted continuously but transmitted in such a manner that it is dispersedly mixed with the data to be corrected. The above arrangement produces such an advantageous effect that the information data arranged regularly in the data area can be transmitted at a predetermined constant time interval.

Furthermore, according to the present invention, when interleaved symbol data or ECC block data is received, the data series and the parity are reproduced from the symbol data or ECC block data, so that the error generated in the data series is corrected. Therefore, when the parity is dispersedly transmitted, the data series and the parity are easily recognized, thereby producing such an advantageous effect that the error generated in the data series is corrected.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Preferred embodiments according to the present invention will be described in detail hereinafter with reference to the attached drawings.

First preferred embodiment

As a first preferred embodiment, an exemplified recording medium in which a parity of an ECC is dispersedly recorded is shown.

Figure 4:
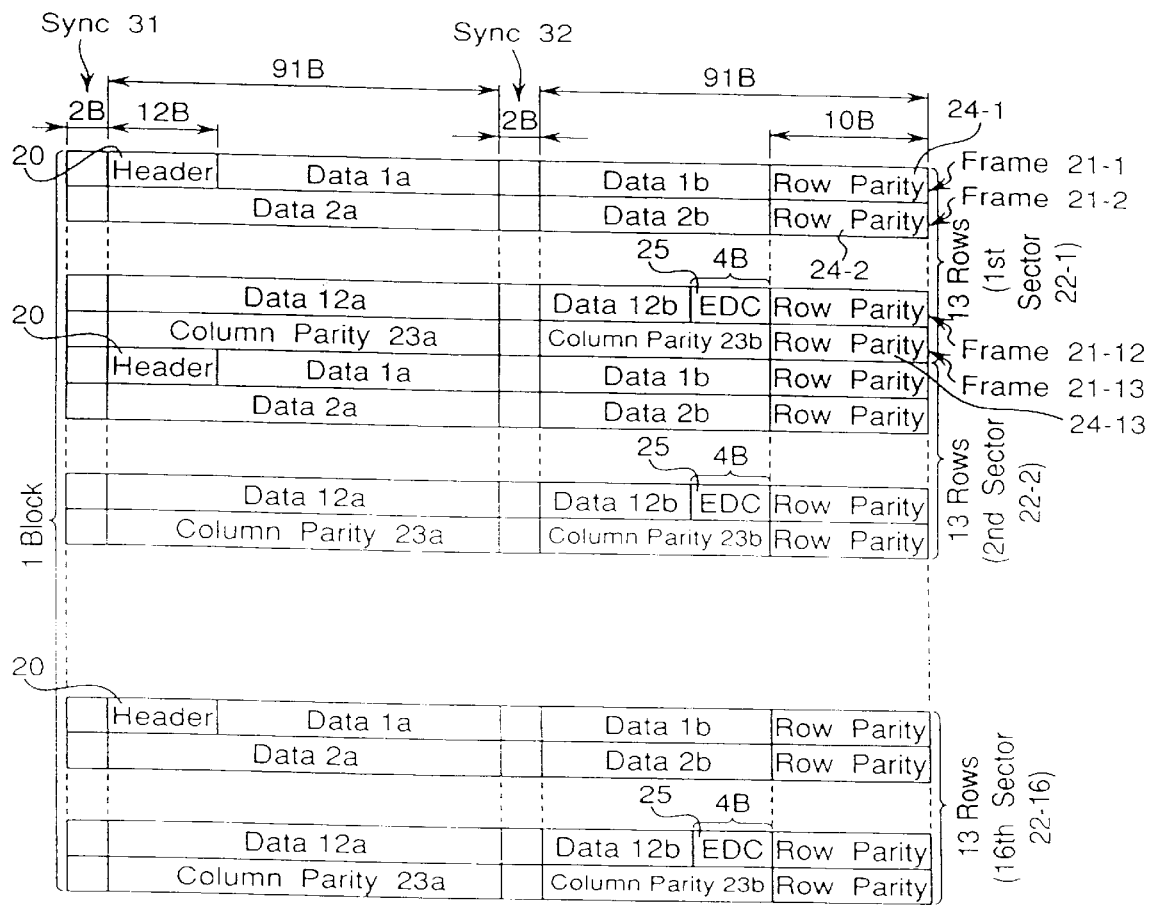
FIG. 4 is a schematic diagram showing a logical data format of one block of an optical disk of a recording medium of a first preferred embodiment according to the present invention.

FIG. 4 shows a logical data format of one block of an optical disk in which ECC words are recorded by a method for arranging a parity of the ECC of the first preferred embodiment according to the present invention.

Figure 1:
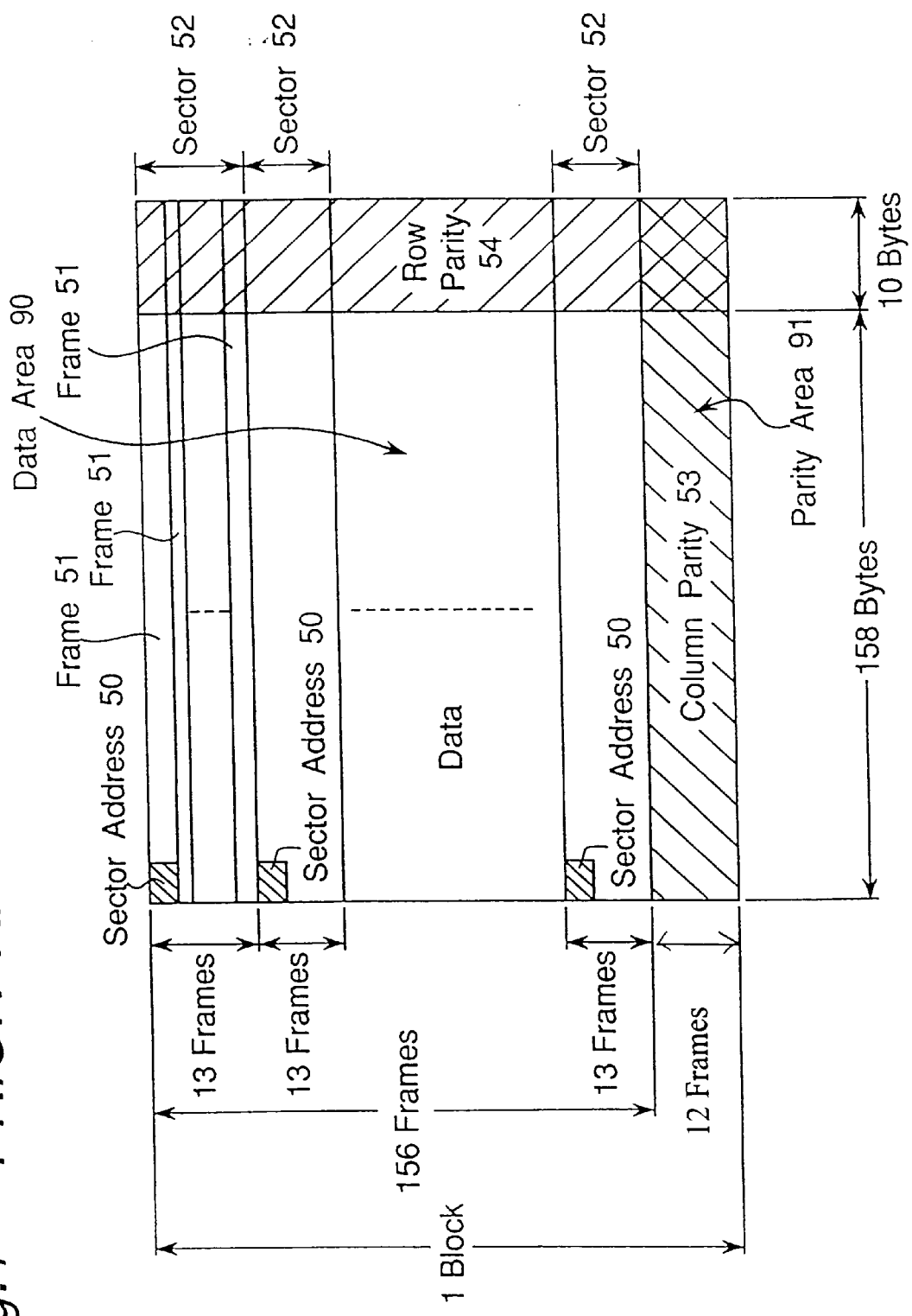
FIG. 1 is a schematic diagram showing a logical data format of one block of an optical disk in which a parity of an ECC is recorded by a prior art method for arranging a parity of an ECC word.

As is apparent from comparison between FIGS. 1 and 4, this logical data format is characterized in that the parity of the ECC includes row parities 24-1 to 24-13 and a pair of column parities 23a and 23b is recorded in each of sectors 22-1 to 22-16, each of the row parities 24-1 to 24-13 is arranged in the tail of each of rows or frames 21-1 to 21-13, and a pair of column parities 23-1a and 23-1b is arranged in the last frame 21-13 of each of the sectors 22-1 to 22-16.

The logical data format of a data structure shown in FIG. 4 will be described in detail below.

Referring to FIG. 4, 1-block data to be transmitted is comprised of 16 sectors 22-1 to 22-16, and each of the sectors 22-1 to 22-16 is comprised of 13 rows, namely, 13 frames 21-1 to 21-13. For synchronous transmission, a first synchronous (Sync) pattern 31 of 2 bytes is added to a part prior to the head of each of the frames 21-1 to 21-13, and a second synchronous (Sync) pattern 32 of 2 bytes is inserted into the middle part of each of the frames 21-1 to 21-13 so as to be arranged between adjacent two information data 1a and 1b, 2a and 2b, . . . , 12a and 12b, or adjacent column parities 23a and 23b. In the preferred embodiments, an ECC word of the ECC in each of the frames 21-1 to 21-13 is constituted so as to exclude the first and second synchronous patterns 31 and 32.

The first sector 22-1 is comprised of 13 frames 21-1 to 21-13, in which, (a) the first frame 21-1 includes a header 20 of 12 bytes, the information data 1a of 79 bytes, the information data 1b of 81 bytes, and a row parity 24-1 of 10 bytes which is calculated based on the header 20 and the information data 1a and 1b;

(b) the second frame 21-2 includes information data 2a of 91 bytes, information data 2b of 81 bytes, and a row parity 24-2 of 10 bytes which is calculated based on the information data 2a and 2b;

(c) the I-th frame 21-I includes information data ia of 91 bytes, information data ib of 81 bytes, and a row parity 24-I of 10 bytes which is calculated based on the information data ia and ib, (I=3, 4, . . . , 11);

(d) the 12-th frame 21-12 includes information data ia of 91 bytes, information data 12b of 77 bytes, an error detection code (EDC) 25 of 4 bytes for the header 20 and information data 1a, 1b, 2a, 2b, . . . , 12a and 12b, and a row parity 24-12 of 10 bytes which is calculated based on the information data 12a and 12b, and the error detection code 25; and (e) the 13-th frame 21-13 includes a column parity 23a of 91 bytes, a column parity 23b of 81 bytes, and a row parity 24-13 of 10 bytes which is calculated based on the column parities 23a and 23b.

Further, each of the second to 16-th sectors 22-2 to 22-16 is comprised of 13 frames 21-1 to 21-13, in a manner similar to that of the first sectors 22-1. In the ECC block data consisting of the sectors 22-1 to 22-16, the column parities 23a are calculated based on all the headers 20, all the information data 1a, 2a, 3a, . . . , and 12a, and the column parities 23b are calculated based on all the information data 1b, 2b, 3b, . . . , and 12b, and all the error detection codes (EDC) 25. Each of the row parities 14-1 to 14-13 are calculated based on the rest of each of the rows or frames 21-1 to 21-13. Furthermore, the row parities 24-13 of all sectors 22-1 to 22-16 can be also be calculated in the mass based on a set of the row parities 24-1 to 24-12 of all the sectors 22-1 to 22-16.

Figure 5:
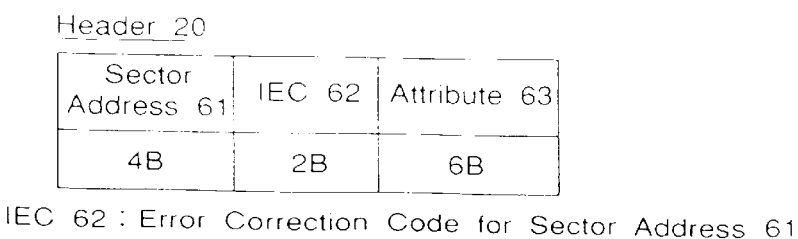
FIG. 5 is a schematic diagram showing a logical data format of a header written in the optical disk of the recording medium shown in FIG. 4.

FIG. 5 shows a logical data format of a header written in the optical disk shown in FIG. 4.

Referring to FIG. 5, the header 20 arranged at the head of each of the sectors 22-1 to 22-16 includes a sector address 61 of 4 bytes, an error correction code (IEC) of 2 bytes for sector address 61, and an attribute data 63 of 6 bytes for representing an attribute of the sector 22. Therefore, one sector address 61 is arranged at the head of each of the sectors 22-1 to 22-16.

In this case, if attention is paid to the information data and parity of one column of one bytes, one column parity of 16 bytes for correcting an error of (12×16)-byte data of one column is arranged uniformly in the column so as to be segmented into 16 column parities each of one byte. That is, the format shown in FIG. 4 differs from the format of FIG. 1 in the location of the column parities 23a and 23b of the 16 sectors if they are compared from each other, and the relation between each parity and series of correction of the data format of the first preferred embodiment shown in FIG. 4 is substantially the same as that of prior art shown in FIG. 1.

Now, attention is paid to timings for detecting the sector addresses 61 when the information data is continuously read out along the track of the optical disk in which the column parities 23a and 23b of the 16 sectors 22-1 to 22-16 are dispersedly recorded as described above.

Figure 2:
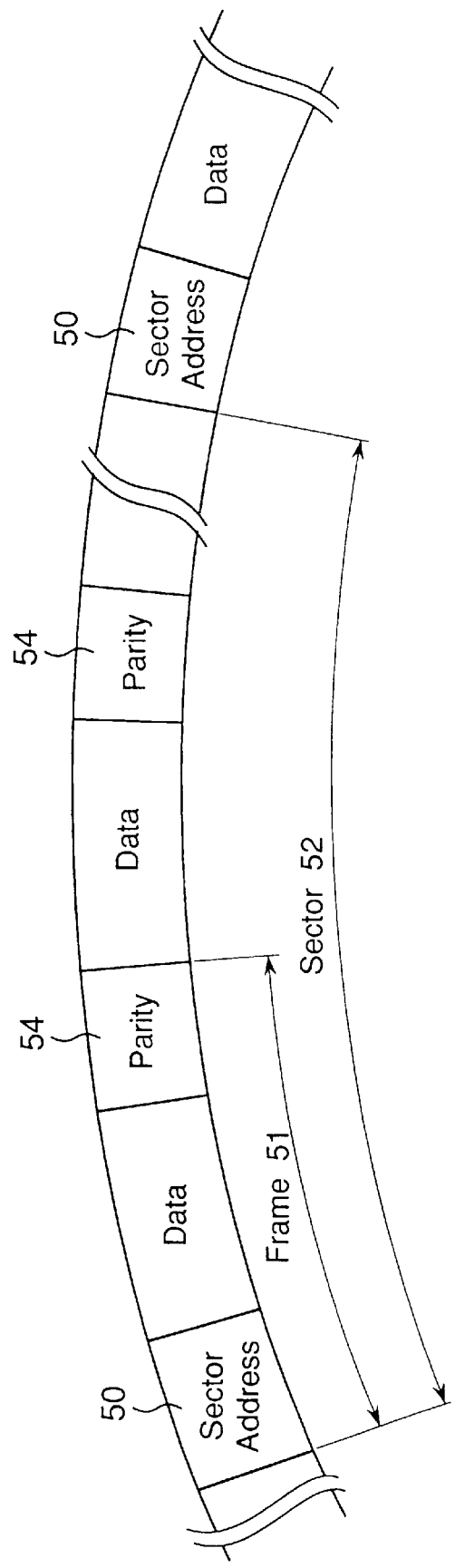
FIG. 2 is a schematic plan view showing a frame and a sector written on a track of a prior art optical disk.
Figure 3:
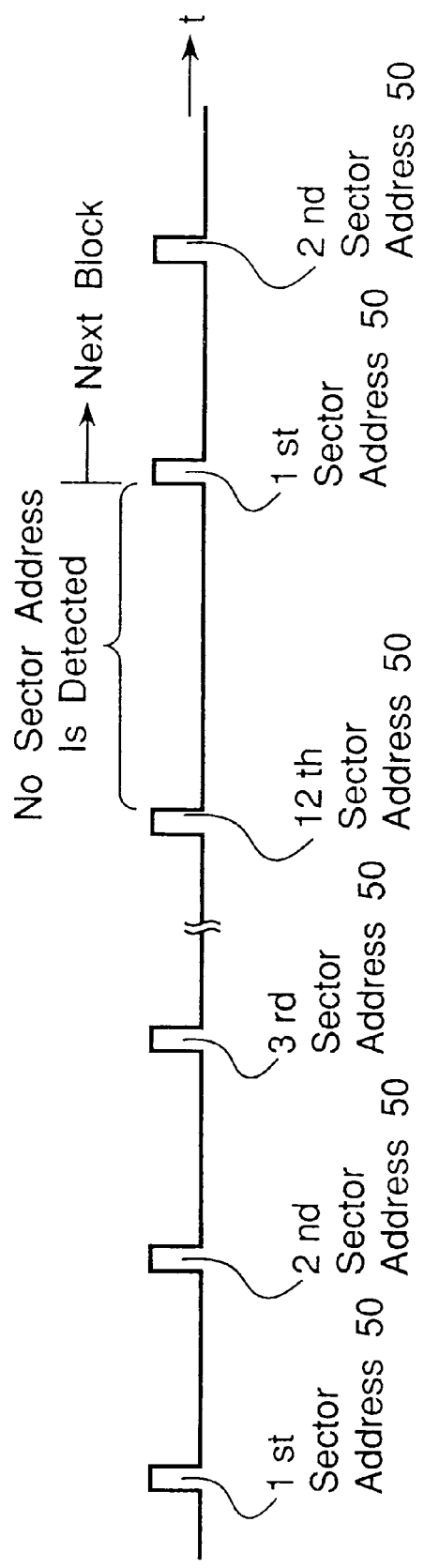
FIG. 3 is a timing chart showing timings for detecting sector addresses when reading out the prior art optical disk shown in FIGS. 1 and 2.

FIG. 4 shows the logical format of one block, and the block is physically recorded continuously in sequence from the uppermost frame along the track of the disk, and in each frame, each data is recorded sequentially from the leftmost byte to the rightmost byte. This is the same as that of the prior art optical disk shown in FIG. 2.

Figure 6:
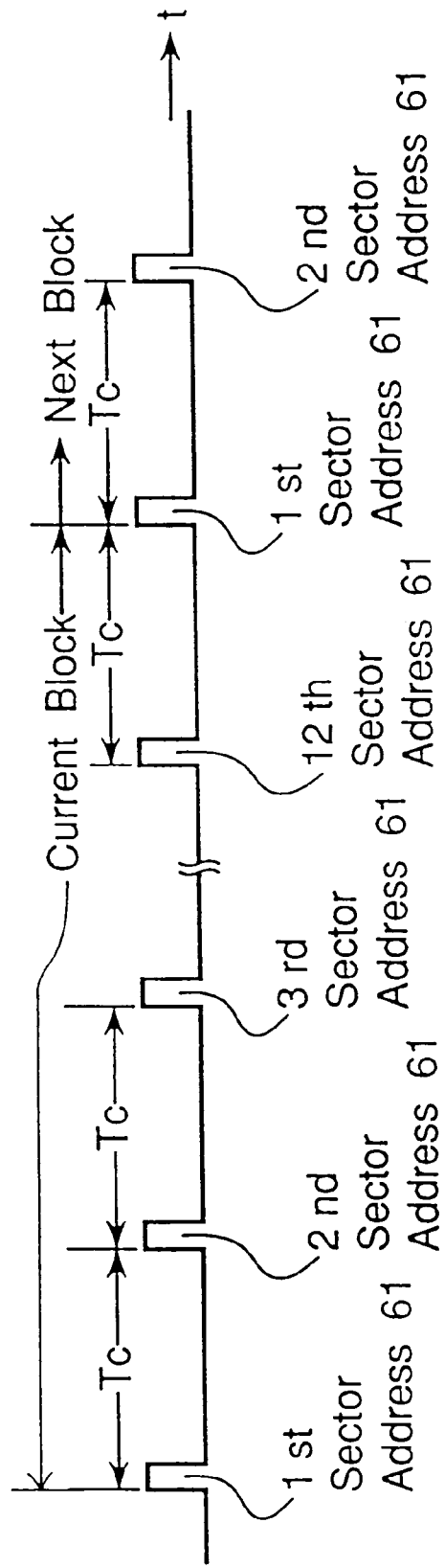
FIG. 6 is a timing chart showing timings for detecting sector addresses in the first preferred embodiment.

FIG. 6 is a timing chart showing timings for detecting sector addresses in the first preferred embodiment.

As shown in FIG. 6, the sector addresses 61 are detected regularly at a predetermined constant time interval Tc even in the detection of the sector addresses 61 performed in the boundary from the current block to the next block. As is apparent from the data format shown in FIG. 4, each sector address 61 is detected once in thirteen frames, and this is the same when the read-out process continues to the next block.

Figure 7:
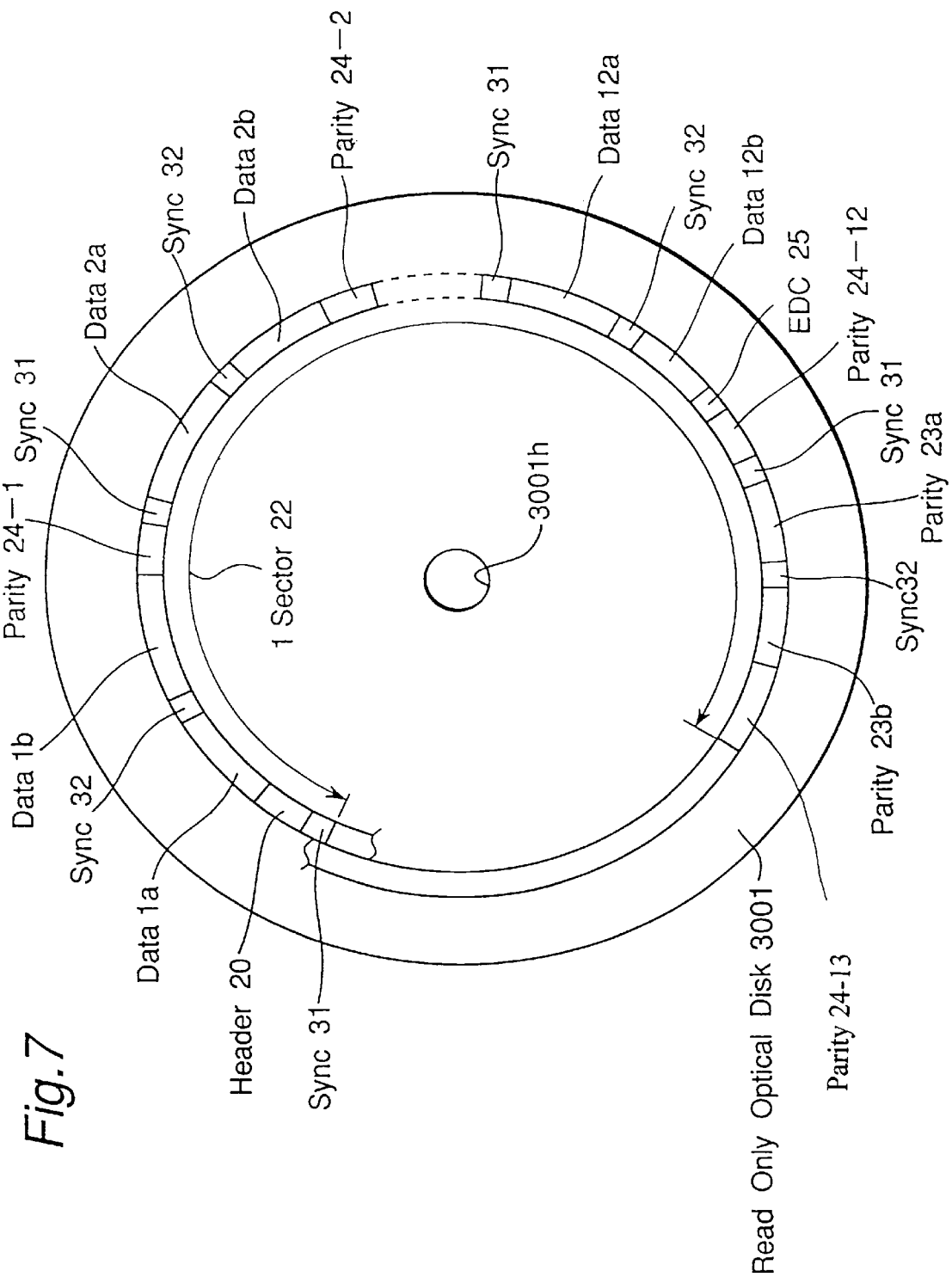
FIG. 7 is a schematic plan view showing a read only optical disk in which the parity is written by the method for arranging the parity of the ECC of the first preferred embodiment.

FIG. 7 is a schematic plan view showing a read only optical disk 3001 in which the parity of the ECC is written by the method for arranging the parity of the ECC of the first preferred embodiment.

Referring to FIG. 7, a recording area is arranged in a spiral shape, and one sector 22 is arranged into a part of a spiral recording area of the read only optical disk 3001 having a center hole 3001h. That is, a CLV (Constant Linear Velocity) method is used as a recording method for the read only optical disk 3001. Further, as is apparent from FIG. 7, each sector address 61 of the header 20 is detected at the predetermined constant time interval Tc in the read only optical disk 3001.

Figure 8:
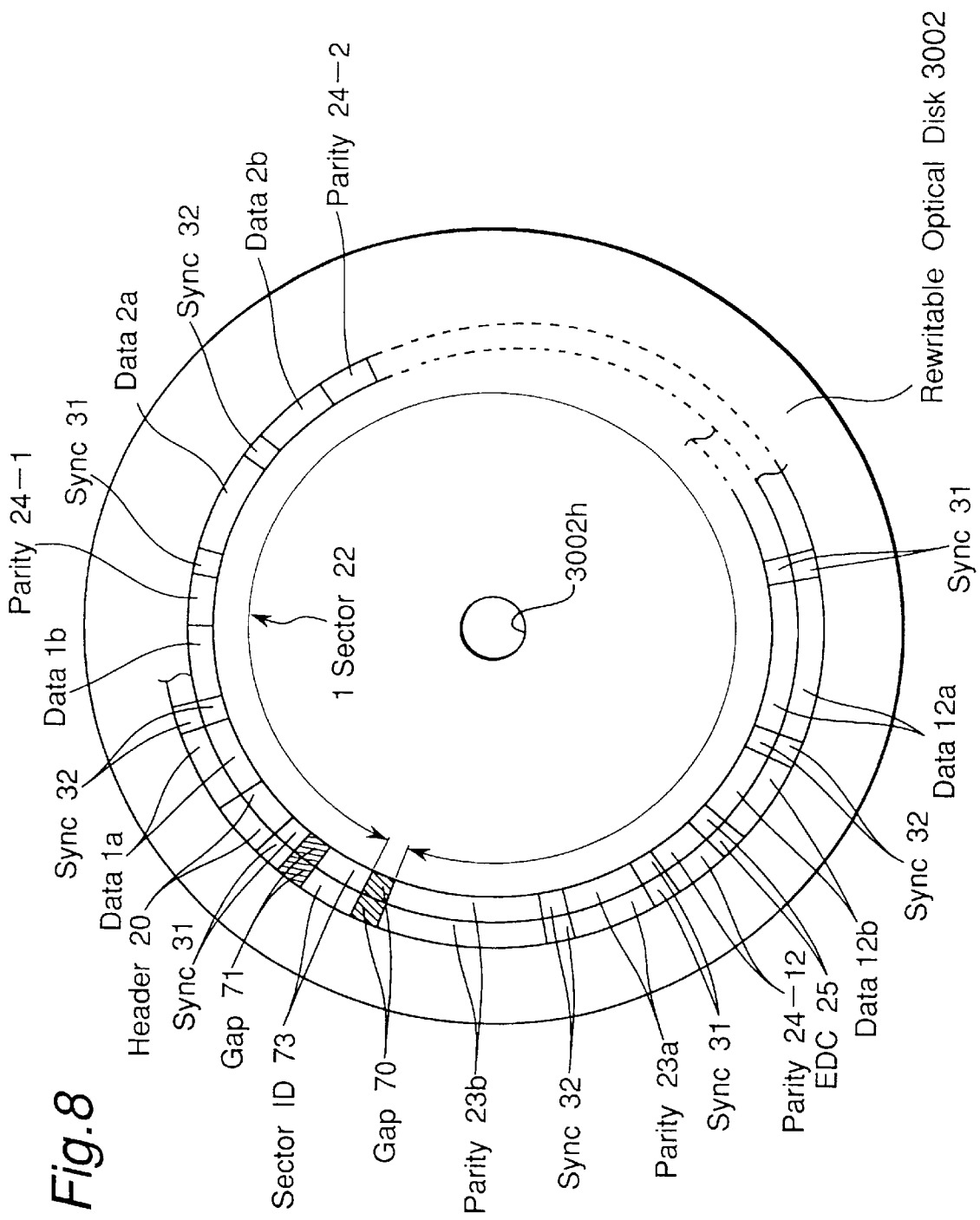
FIG. 8 is a schematic plan view showing a rewritable optical disk in which the parity is written by the method for arranging the parity of an ECC of the first preferred embodiment.

FIG. 8 is a schematic plan view showing a rewritable optical disk 3002 in which the parity of the ECC is written by the method for arranging the parity of the ECC of the first preferred embodiment.

Referring to FIG. 8, a recording area is arranged in a spiral shape, and one sector 22 is arranged into a part of one turn of an recording area of the rewritable optical disk 3002 having a center hole 3002h. That is, a zoned CAV (Constant Angular Velocity) method is used as a recording method for the rewritable optical disk 3002. Further, as is apparent from FIG. 8, each sector address 61 of the header 20 is detected at the predetermined constant time interval Tc in the rewritable optical disk 3002.

As is apparent from the above description of the first preferred embodiment, each sector address 61 of the header 20 is detected at the predetermined constant time interval Tc in the optical disk 3001 or 3002 of the recording medium of the present preferred embodiment in a manner different from that of the case of the prior art shown in FIG. 1. In the present case, data to be regularly detected is of course not limited to the sector address. For example, the data to be regularly detected may be the header 20. That is, data arranged so as to be interleaved in corresponding positions in an identical column or frame 21 of each of the sectors 22 is guaranteed to be surely detected at the predetermined constant time interval Tc.

Second preferred embodiment

As a second preferred embodiment, an exemplified data transmission system for dispersedly transmitting a parity of an ECC is shown.

Figure 9:
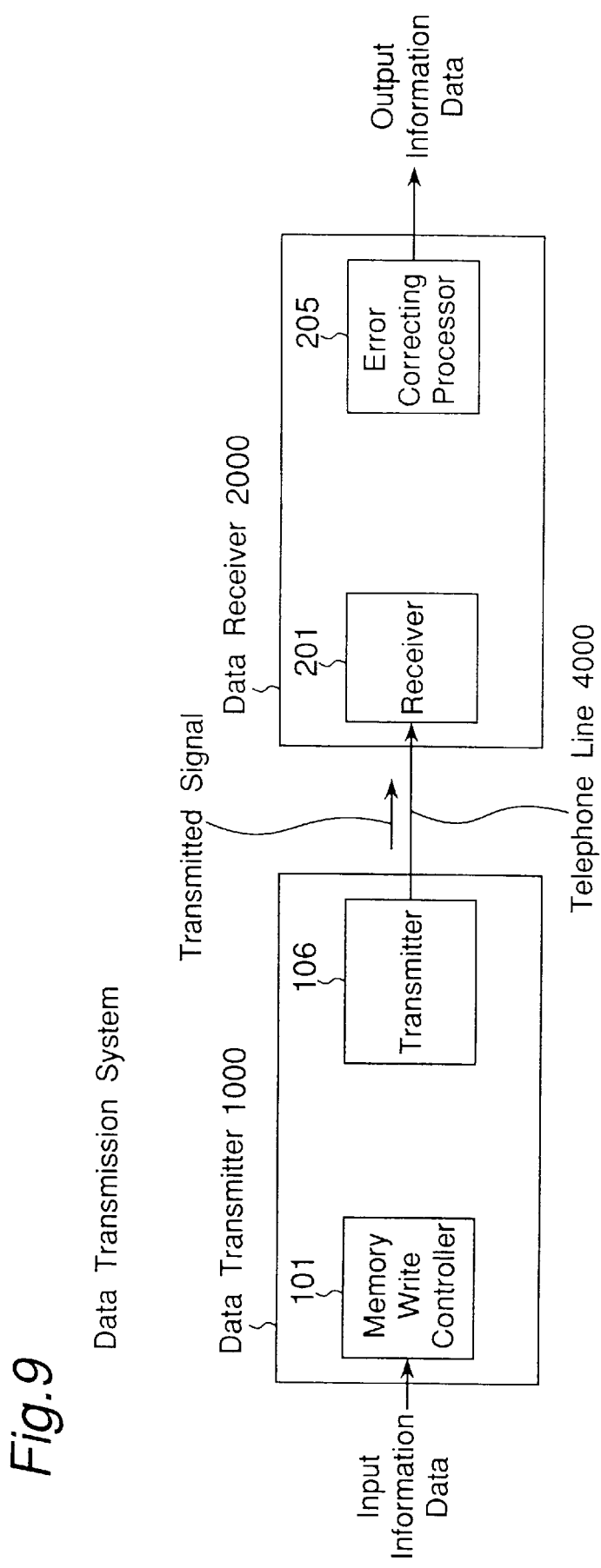
FIG. 9 is a block diagram showing a composition of a data transmission system of a second preferred embodiment according to the present invention.

FIG. 9 is a block diagram showing a composition of a data transmission system of a second preferred embodiment according to the present invention.

Referring to FIG. 9, the data transmission system comprises a data transmitter 1000 and a data receiver 2000. Input data is inputted to a memory write controller 101, and then, the input data is processed in the data transmitter 1000 in a manner as described in detail later. Thereafter, a transmitted signal including the input data and a parity of an ECC is transmitted from a transmitter 106 through a telephone line 4000 to a receiver 201 of the data receiver 2000. The transmitted signal is received by the receiver 201, and then is processed in the data receiver 2000 in a manner as described in detail later. Then, output data is outputted from an error correcting processor 205 of the data receiver 2000.

Figure 10:
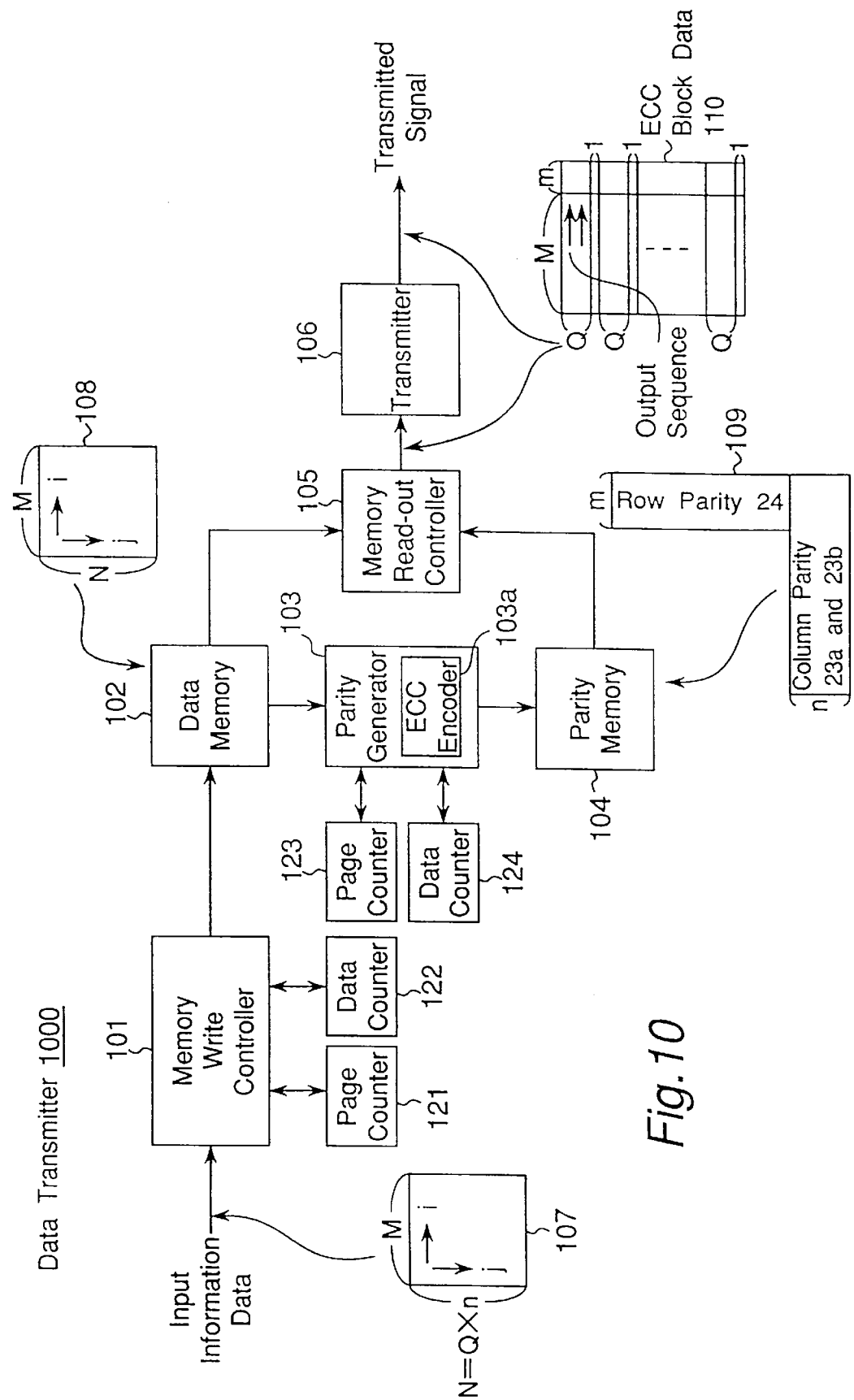
FIG. 10 is a block diagram showing a composition of a data transmitter shown in FIG. 9.

FIG. 10 is a block diagram showing a composition of the data transmitter 1000 shown in FIG. 9. It is to be noted that FIG. 10 includes conceptual diagrams of not only data 108 and 109 stored respectively in a data memory 102 and a parity memory 104, but also data 107 and 110 flowing through the respective paths for the sake of better perception and better understanding.

The data transmitter 1000 comprises the memory write controller 101, the data memory 102, a parity generator 103 having an ECC encoder 103a, the parity memory 104, a memory read-out controller 105 and the transmitter 106. In the data transmitter 1000, the memory write controller 101 comprises a page counter 121 and a data counter 122, and the parity generator 103 comprises a page counter 123 and a data counter 124.

The memory write controller 101 comprises the page counter 121 for counting a page number corresponding to a block number and the data counter 122 for counting a row number j in byte and a column number i in byte, and latches or temporarily stores the input data sent from an external unit, then stores the input data into the data memory 102 having a memory capacity of two pages (pages "0" and "1") corresponding to two blocks, based on the numbers i, j and p indicated by the page and data counters 121 and 122. The data transmission system manages data of N rows×M columns as one block, and transmits data in a unit of one block with a parity attached thereto. In the second preferred embodiment, N is (12×16) frames, and M is 182 bytes except for synchronous patterns 31 and 32, as is apparent from FIG. 4. Therefore, the memory write controller 101 latches the input data 107 of N rows×M columns as a unit or one block, from the external unit.

The parity generator 103 comprises the ECC encoder 103a inside thereof, and the page counter 123 for counting a page number corresponding to a block number and a data counter 124 for counting a row number j in byte and a column number i in byte. The parity generator 103 calculates a parity for the information data 108 of N rows×M columns stored in the data memory 102, using, for example, the Reed-Solomon coding method which has been already known to those skilled in the art. In practice, the parity generator 103 calculates the row parity 24 comprised of m bytes for correcting an error of the row ECC word of each row comprised of M bytes of data and m-byte row parity. In the preferred embodiment, m is 10 bytes as is apparent from FIG. 4. Furthermore, in the direction of column, the parity generator 103 similarly calculates the column parity 23a or 23b comprised of n bytes for correcting an error of the column ECC word series of each column comprised of N bytes of data and n-bytes of the column parity 23a or 23b. In the preferred embodiment, n is 16 bytes, as is apparent from FIG. 4.

The parity data 109 calculated by the parity generator 103 is stored into the parity memory 104. The data memory 102 and the parity memory 104 are provided in different blocks with regard to the type of the information data stored in each of the memories 102 and 103, however, they are practically allocated to areas of different addresses in a RAM comprised of a semiconductor memory or the like.

The memory read-out controller 105 reads out the information data 108 of N rows×M columns stored in the data memory 102 and the parity 109 stored in the parity memory 104 according to a predetermined procedure, and transmits to the transmitter 106 the information data 108 and parity data 109 as a transmission data or an ECC block data 110 in which the information data of one block and the parity are mixed together. It is to be noted that the transmission data 110 has the same format as that of FIG. 4 described in the first preferred embodiment.

Therefore, the symbol data or ECC block data is sent by the memory read-out controller 105 so that the row parity 24 and the column parities 23a and 23b are sent at intervals of each sector 22, wherein the sector 22 is defined as an data area obtained by dividing one data block area of a predetermined data amount into a plurality of sectors 22 each having an identical data amount, or as a part of the transmitted data for transmitting information data of a predetermined amount including the EDC 25. Hereinafter, the data including the information data 108 and the parity data 109 is referred to as an ECC block data 110.

The transmitter 106 comprises a modulator and an amplifier. The transmitter 106 modulates a carrier signal according to the transmission ECC block data 110 including the information data 108 and the parity data 109 which is sent from the memory read-out controller 105, using a predetermined digital modulation method such as FSK, PSK, QAM or the like, then amplifies the modulated transmitted signal, and transmits the transmitted signal through the telephone line 4000 of a public switched telephone network to the receiver 201 of the data receiver 2000 as shown in FIG. 9.

In the preferred embodiment, the read-out controller 105 controls the transmitter 106 to transmit the information data stored in the data memory 102, and the row parities 24 and the column parities 23a and 23b stored in the parity memory 104 so that each data component of the information data obtained by dividing the information data of one data block area into a plurality of data components and each parity component of the row parities 24 and the column parities 23a and 23b obtained by dividing the row parities 24 and the column parities 23a and 23b of one block area into a plurality of parity components are transmitted at intervals of each sector 22.

In the preferred embodiment, the parity of the ECC includes row parities 24 and column parities 23a and 23b, and each sector 22 is comprised of a plurality of frames 21. The read-out controller 105 controls the transmitter 106 to transmit the row parity 24 at the tail of each frame 21 after each data component, and the column parities 23a and 23b in the last frame 21 of each sector 22.

Figure 11:
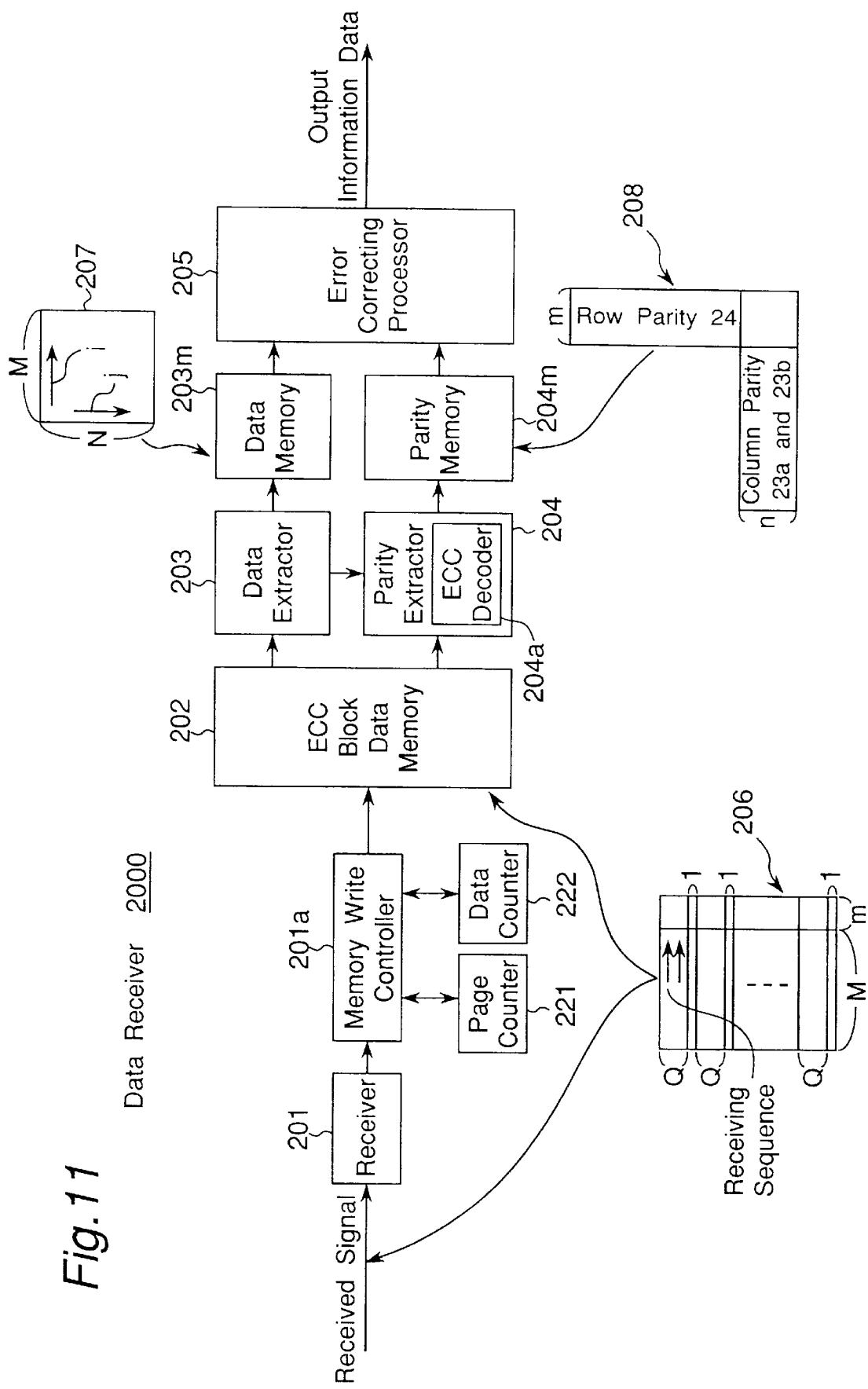
FIG. 11 is a block diagram showing a composition of a data receiver shown in FIG. 9.

FIG. 11 is a block diagram showing a composition of the data receiver 2000 shown in FIG. 9. It is to be noted that FIG. 11 includes conceptual diagrams of data 207 and 208 stored respectively in a data memory 203m and a parity memory 204m and data 206 flowing through each path for the sake of better perception and better understanding.

The data receiver 2000 comprises the receiver 201, a memory write controller 201a, an ECC block data memory 202, a data extractor 203, a parity data extractor 204, the data memory 203m, the parity memory 204m, and the error correcting processor 205. In the data receiver 2000, the memory write controller 201a comprises a page counter 221 for counting a page number corresponding to a block number and a data counter 222 for counting a row number j in byte and a column number i in byte, and the parity extractor 204 comprises an ECC decoder 204a inside thereof.

The receiver 201 comprises a telephone receiver and a demodulator, and receives a received signal including the ECC block data 110 of FIG. 10 which is sent from the data transmitter 1000, then demodulates the modulated signal of the received signal using a predetermined demodulation method corresponding to the modulation method used in the transmitter 106 shown in FIG. 10 so as to generate received data including the ECC block data 110, which is sent to the memory write controller 201a. The memory write controller 201a stores the input data into the ECC block data memory 202 based on the numbers p, i and j indicated by the page and data counters 221 and 222. In the present case, it is assumed that the received data 206 is comprised of data of (N+n) rows×(M+m) columns and parities having a data structure shown in FIG. 4. In the preferred embodiment, the information data and the parity are represented by symbols each of one byte. It is to be noted that the ECC block data memory 202 has a storage capacity of to two pages (pages "0" and "1") corresponding to two blocks, in a manner similar to that of the data memory 102 shown in FIG. 10.

The data extractor 203 extracts and reads out only the information data 207 from the received ECC block data 206 stored in the ECC block data memory 202, and then transmits the extracted data 207 to the error correcting processor 205 through the data memory 203m of a data buffer memory. In other words, the data extractor 203 extracts the information data of one block area by combining a plurality of data components, as shown in 207 of FIG. 11.

On the other hand, the parity data extractor 204 extracts and reads out only the parity 208 from the received ECC block data 206 stored in the ECC block data memory 202, and then transmits the parity 208 to the error correcting processor 205 through the parity memory 204m of a parity buffer memory. In other words, the parity data extractor 204 extracts the parity of one block area by combining a plurality of parity components, as shown in 208 of FIG. 11.

The error correcting processor 205 executes a predetermined calculating process by means of the information data 207 transmitted from the data extractor 203 and the parity 208 transmitted from the parity data extractor 204, and then outputs the resulting data whose errors have been corrected as output data. In other words, the error correcting processor 205 corrects an error in the information data of the ECC word of one block area extracted by the data extractor 203 and the parity extractor 204, using a predetermined error correcting decoding method corresponding to the error correcting encoding method of the data transmitter 1000, based on the parity of the ECC extracted by the parity extractor 204, and outputs an error-corrected information data.

The operation of the data transmission system comprising the data transmitter 1000 and the data receiver 2000 constructed as above will be described below with reference to FIGS. 10 to 17.

Figure 12:
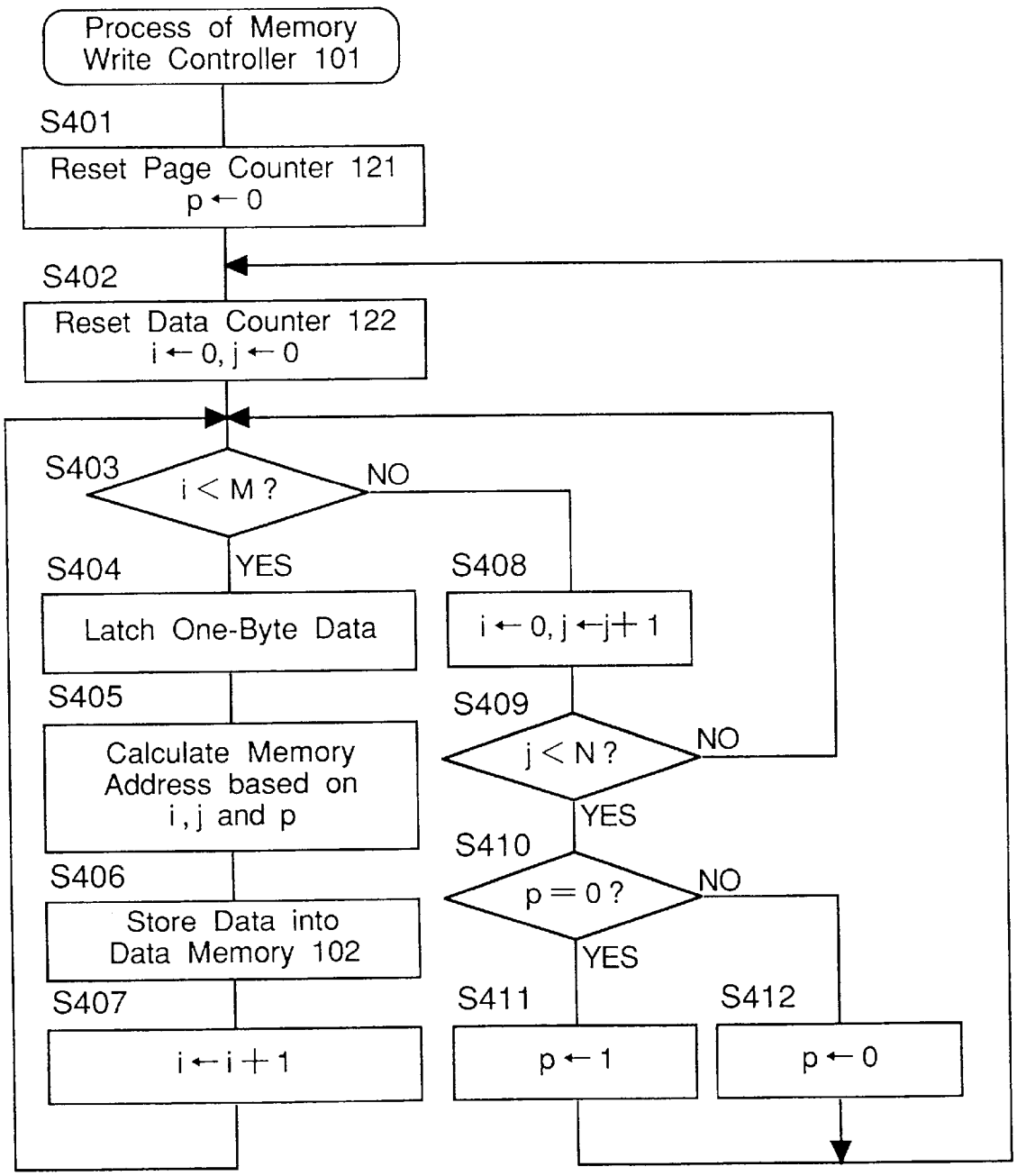
FIG. 12 is a flowchart showing a process of a memory write controller shown in FIG. 10.

FIG. 12 is a flowchart showing a process of the memory write controller 101 which obtains and latches the input data 107 of N rows×M columns. In the present case, the data memory 102 has a storage capacity of a total of two pages (pages "0" and "1"), where the information data of N rows×M columns corresponds to one page. The page counter 121 shown in FIG. 10 serves to perform a buffering process with switching between two pages for storing input data in steps S401 and S410 to S412. Each one-byte input data is stored into the data memory 102 sequentially from the left side to the right side in each row or frame in steps S403 to S407 and sequentially from the uppermost row or frame to the lowermost row or frame in steps S408 to S409.

Figure 13:
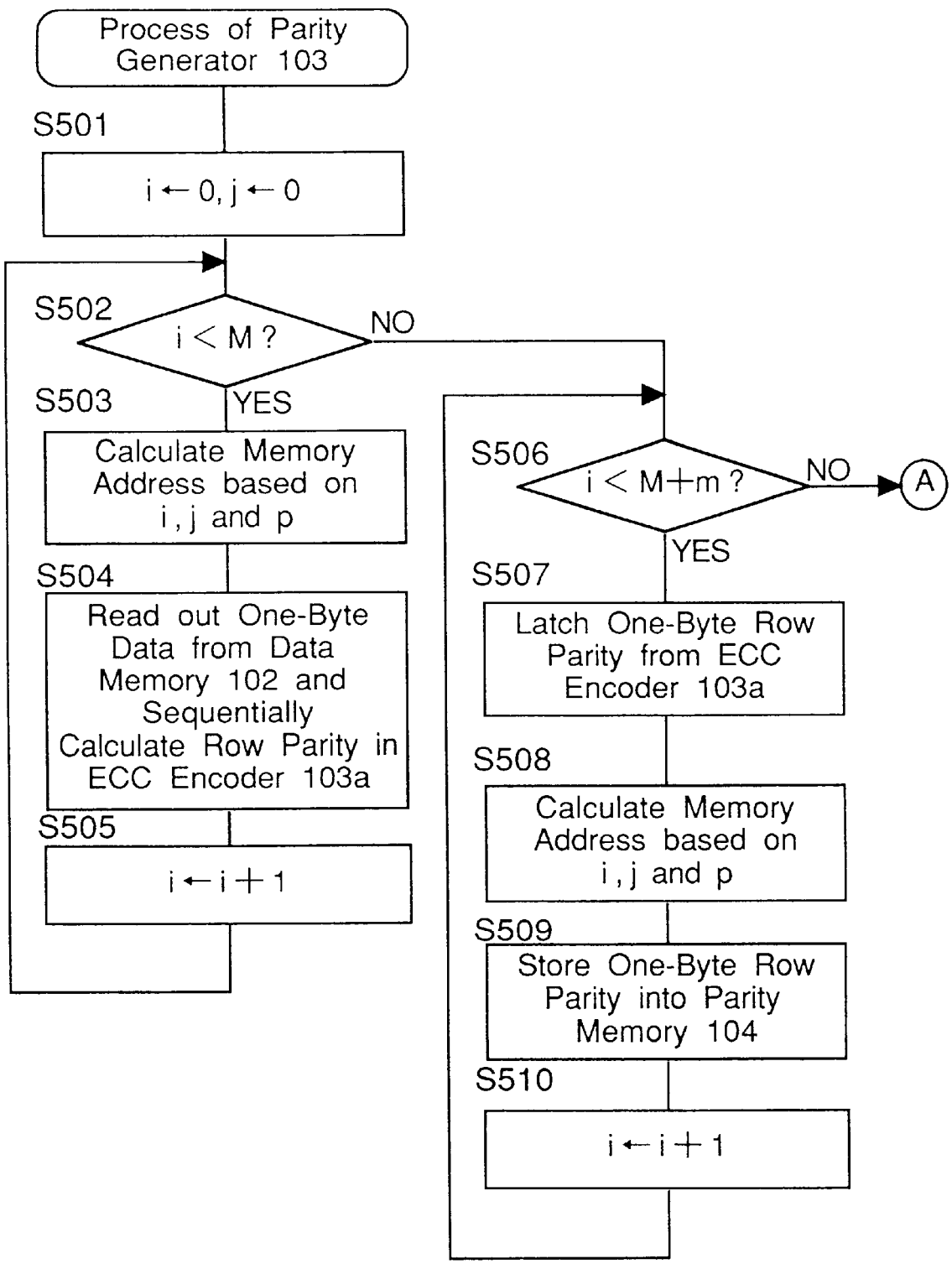
FIG. 13 is a flowchart showing a first part of a process of a parity generator shown in FIG. 10.
Figure 14:
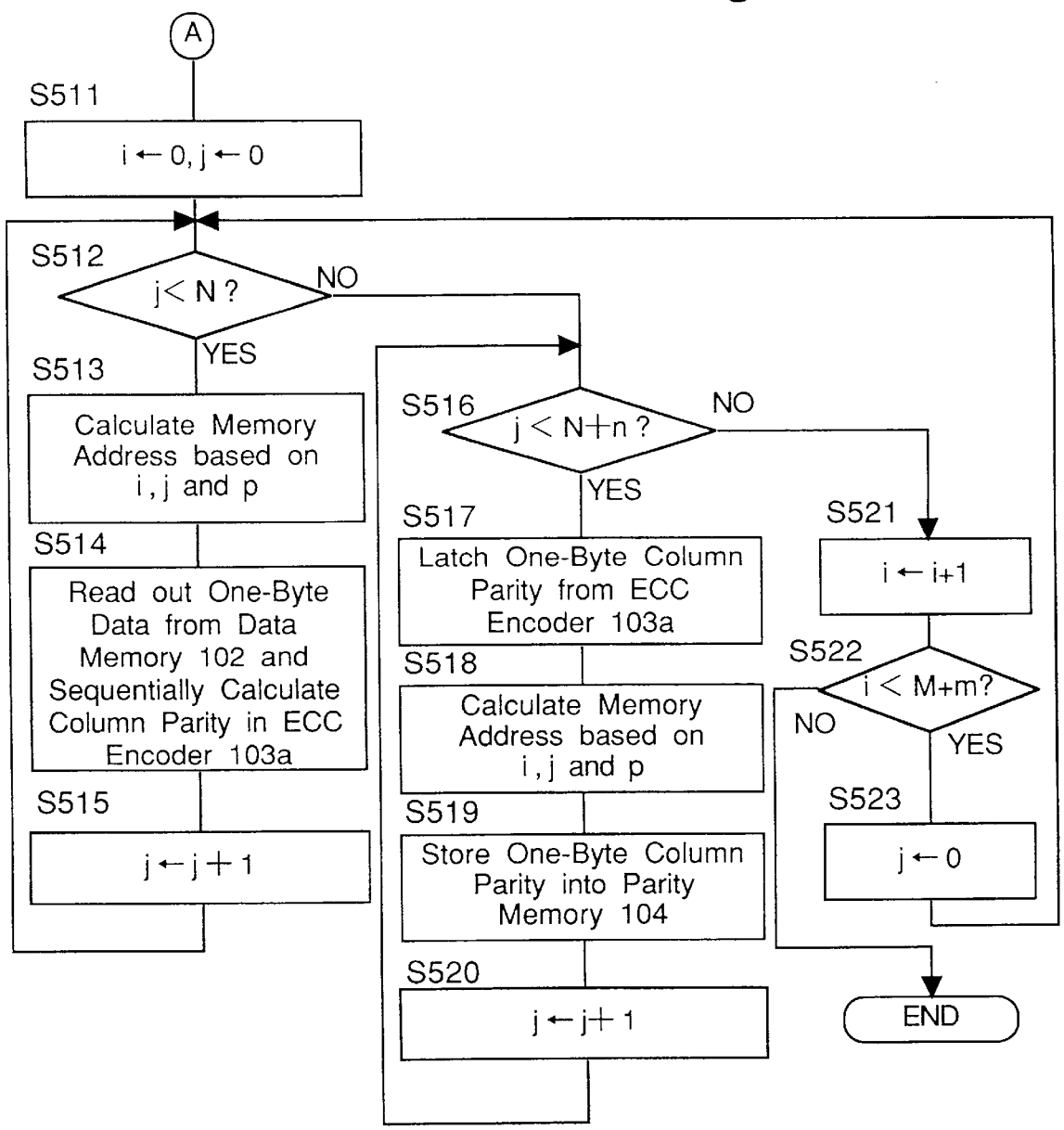
FIG. 14 is a flowchart showing a second part of the process of the parity generator shown in FIG. 10.

FIGS. 13 and 14 are flowcharts showing a process of the parity generator 103 of FIG. 10 for calculating the parity. In the present case, the ECC encoder 103a is provided inside the parity generator 103, and has the following structure: when plural-bytes data is inputted into the ECC encoder 103a one-byte by one-byte, calculation is performed by the ECC encoder 103a one byte by one byte.

When the information data of one row or frame stored in the data memory 102 is read out by repeatedly reading out one-byte data from the data memory 102 and one row parity 24 of ten bytes for one frame is calculated in steps S501 to S505, the one row parity 24 of ten bytes for one frame is stored in the position of the row parity 24 of the parity memory 104 in steps S506 to S510. Thereafter, according to a similar procedure, data in the column direction is read out by repeatedly reading out one-byte data from the data memory 102 and 16-byte parity symbols on the column in the column parities 23a or 23b, or the last row parity 24-13 of each sector 22 are calculated in steps S511 to S515, and then, the parity symbols of the column parities 23a or 23b, or the last row parity 24-13 of each sector 22 are stored in the position of the column parities of the parity memory 104 in steps S516 to S520. This procedure is repeated until the rightmost column in step S521 to S523.

Figure 15:
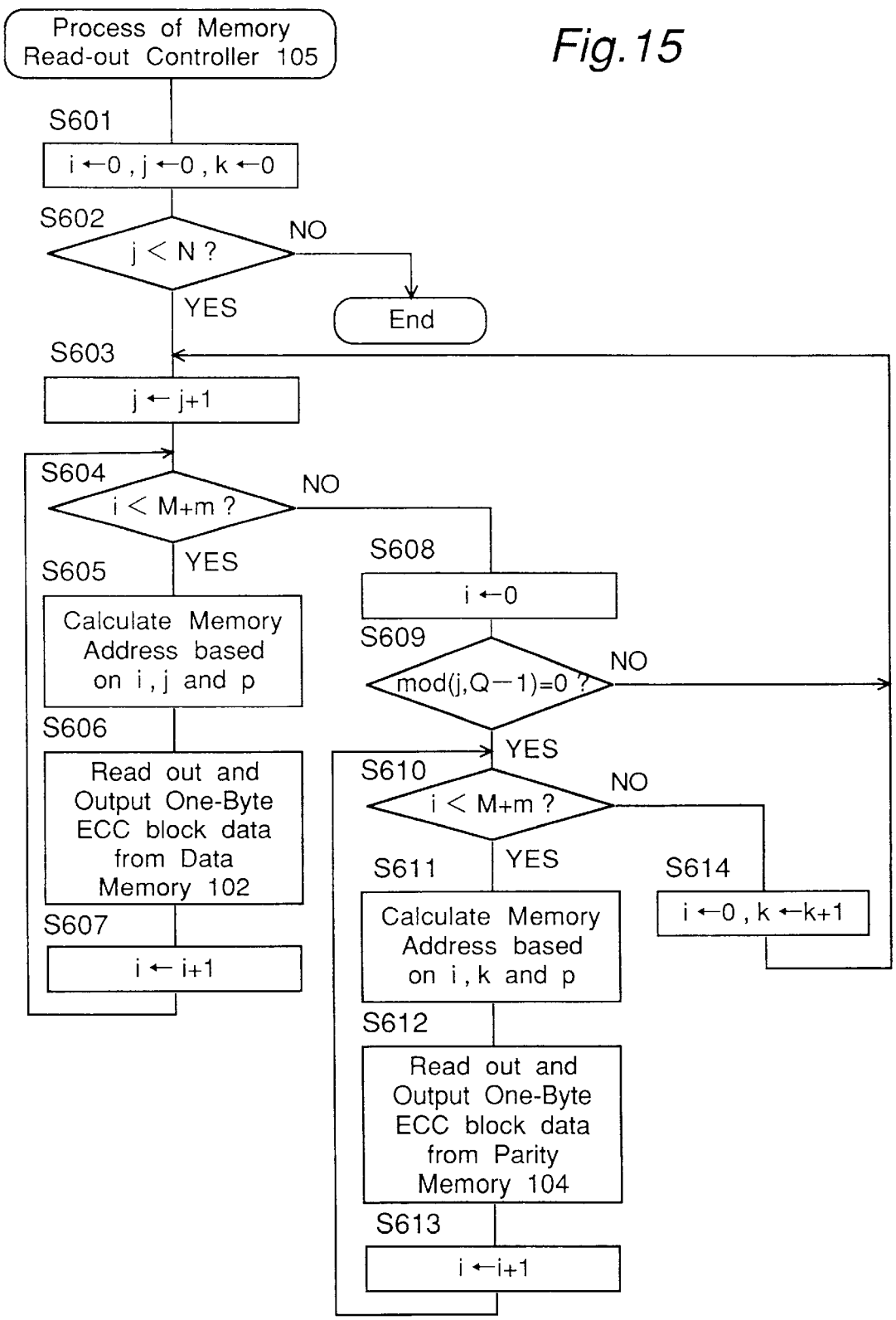
FIG. 15 is a flowchart showing a process of a memory read-out controller shown in FIG. 10.

FIG. 15 is a flowchart showing a process of the memory read-out controller 105 of FIG. 10. A read-out output sequence is indicated in the transmitted ECC block data 110 of FIG. 10, where data of one row or frame including the row parity 24 is sequentially read out from its uppermost row or frame, and then is transmitted to the transmitter 106 in steps S601 to S607. It is to be noted that one row parity frame or the last frame including the column parities 23a and 23b and the row parity 24-13 is read out every time Q data frames are read out in steps S608 to S614. By this operation, the frames 21-13 of the column parities 23a and 23b are dispersedly transmitted from the transmitter 106. The case where the information data is read out from the data memory 102 in step S606 and the case where the parity is read out from the parity memory 104 in step S612 are not necessary to be specifically distinguished from each other in the flowchart of FIG. 15. Because they are merely located in different addresses of one storage area in practice.

As is apparent from the above description, the input data 107 of N rows×M columns obtained by the memory write controller 101 is processed by the data transmitter 1000 so as to attach the parity 109 to the information data, and the parity 109 is transmitted from the transmitter 106 dispersedly in the form of interleaved data in the column direction.

Figure 16:
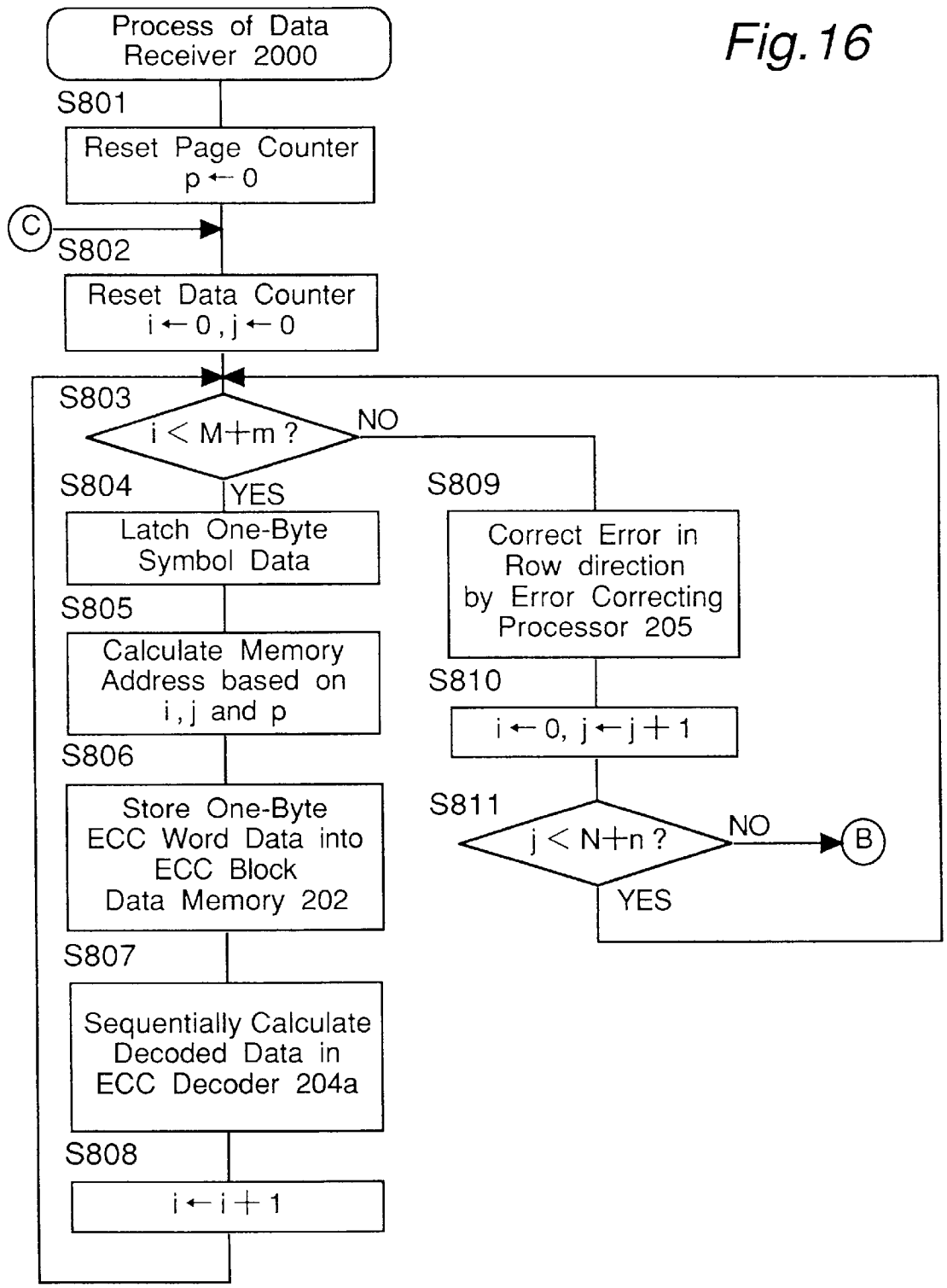
FIG. 16 is a flowchart showing a first part of a process of a data receiver shown in FIG. 11.
Figure 17:
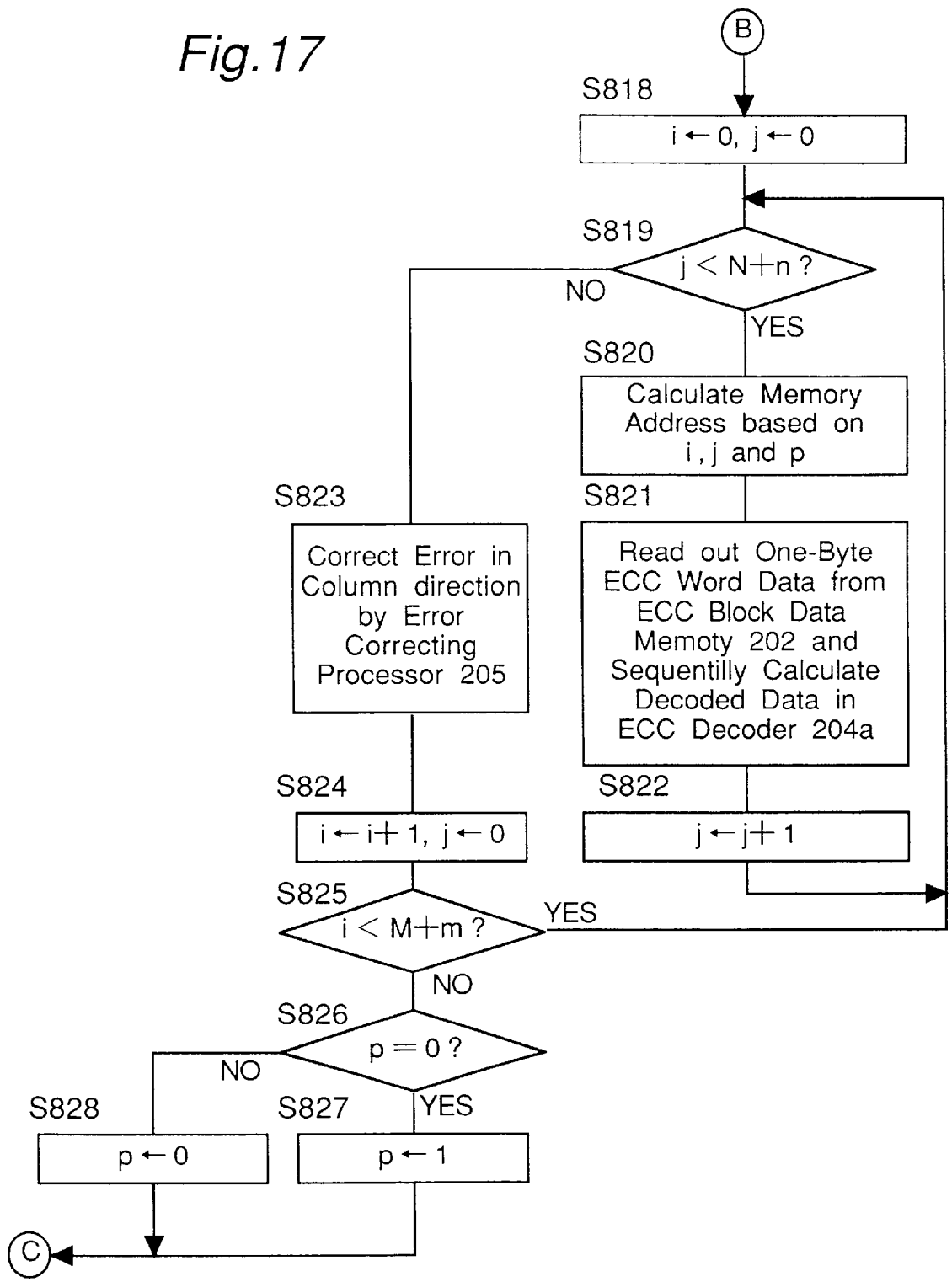
FIG. 17 is a flowchart showing a second part of the process of the data receiver shown in FIG. 11.

FIGS. 16 and 17 are flowcharts showing a process of the data receiver 2000 for executing an error correcting process by obtaining the received data 206 comprised of symbols of (N+n) rows×(M+m) columns.

In the present case, the ECC decoder 204a is provided inside the parity extractor 204, and has the following structure: when plural-bytes data is inputted into the ECC decoder 204a one-byte by one-byte, the calculation is executed one-byte by one-byte by the ECC decoder 204a.

When receiving the ECC word of one frame, the error correcting process is executed in the row direction in steps S801 to S809. This process is repeated for all the frames in steps S810 to S811. When the error correcting process in the row direction is completed, subsequently the error correcting process in the row direction is executed according to a similar procedure in steps S818 to S825. When the error correcting process of the ECC words or ECC block data corresponding to one page is completed through the above-mentioned process, then, the same error correcting process is repeated for the symbol stored in another page of the ECC block data memory 202 in steps S826 to S828.

As is apparent from the above description, the symbols of (N+n) rows×(M+m) columns obtained by the receiver 201 are subjected to the error correcting process in the data receiver 2000, and then, the error-corrected data of (N rows)×(M columns) is outputted from the error correcting processor 205.

Third preferred embodiment

Figure 18:
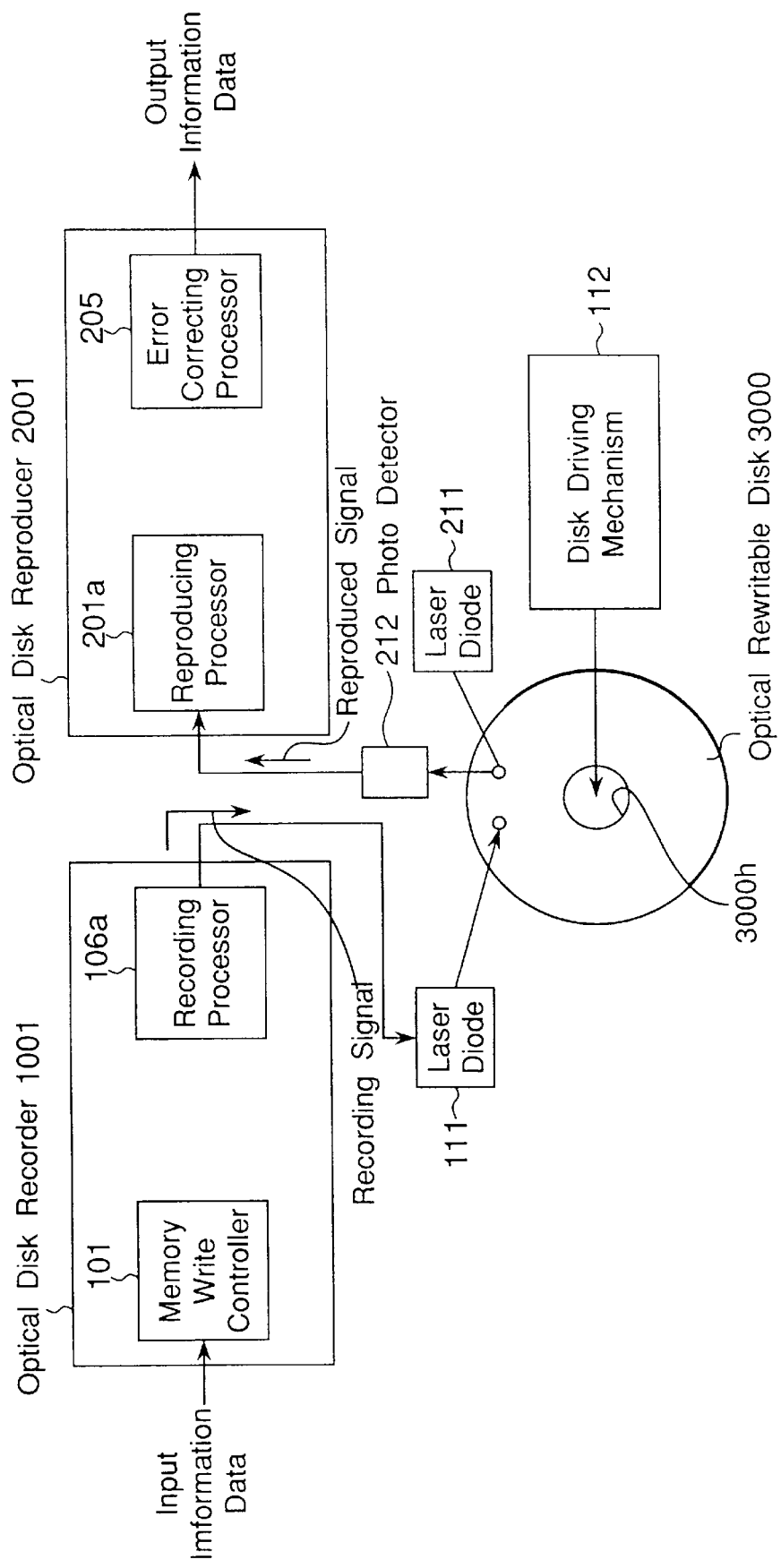
FIG. 18 is a block diagram showing a composition of a phase-change type optical disk recording and reproducing apparatus of a third preferred embodiment according to the present invention.

FIG. 18 is a block diagram showing a composition of a phase-change type optical disk recording and reproducing apparatus of a third preferred embodiment according to the present invention.

As is apparent from comparison between FIGS. 9 and 18, the differences between the second and third preferred embodiments are as follows:

(1) a recording processor 16a is provided in stead of the transmitter 106;

(2) a reproducing processor 201a is provided in stead of the receiver 201; and (3) a disk driving mechanism 112 for rotating the disk 3000, laser diodes 111 and 211 and a photo detector 212 are further provided to the second preferred embodiment shown in FIG. 9.

In response to the input data with the parity sent from the memory read-out controller 105, the recording processor 106a converts the input data into a recording signal, amplifies the recording signal, and then outputs the amplified recording signal to the laser diode 111. The laser diode 111 generates laser light modulated according to the recording signal for recording and projects the laser light onto a part of the disk 3000 to be recorded. On the other hand, the laser diode 211 generates a relatively weak continuous laser light for reproducing and projects the laser light onto a part of the disk 3000 to be reproduced, and then, a reflected light on the part of the disk 3000 is incident onto the photo detector 212 which detects the reflected light, converts the same into an electric signal, and outputs the electric signal to the reproducing processor 201a. The reproducing processor 201a performs a waveform-shaping process so as to convert the input electric signal into a pulse-shaped digital data.

In the optical disk 3000, an optical recording layer is formed, in which a first reflectance represents information data "0", and a second reflectance represents information data "1".

Upon recording of information data "0" or "1", the laser light of a first intensity or a second intensity is respectively projected from the laser diode 111 onto a part of the disk 3000 to be recorded. Then, the reflectance of the recording layer becomes a first value or a second value according to the intensity of the laser light.

On the other hand, upon reading-out of information data, the weak laser light is continuously projected from the laser light 211 onto a part of the disk 3000 to be reproduced, and then a value, e.g. an intensity of the reflected light is detected by the photo detector 212.

In the third preferred embodiment, the rewritable disk 3000 is used, however, the present invention is not limited to this. The present invention can be applied to the other kind of disk recording and reproducing apparatus, such as a read only optical disk, an additional recordable disk or the like.

Fourth preferred embodiment

Figure 19:
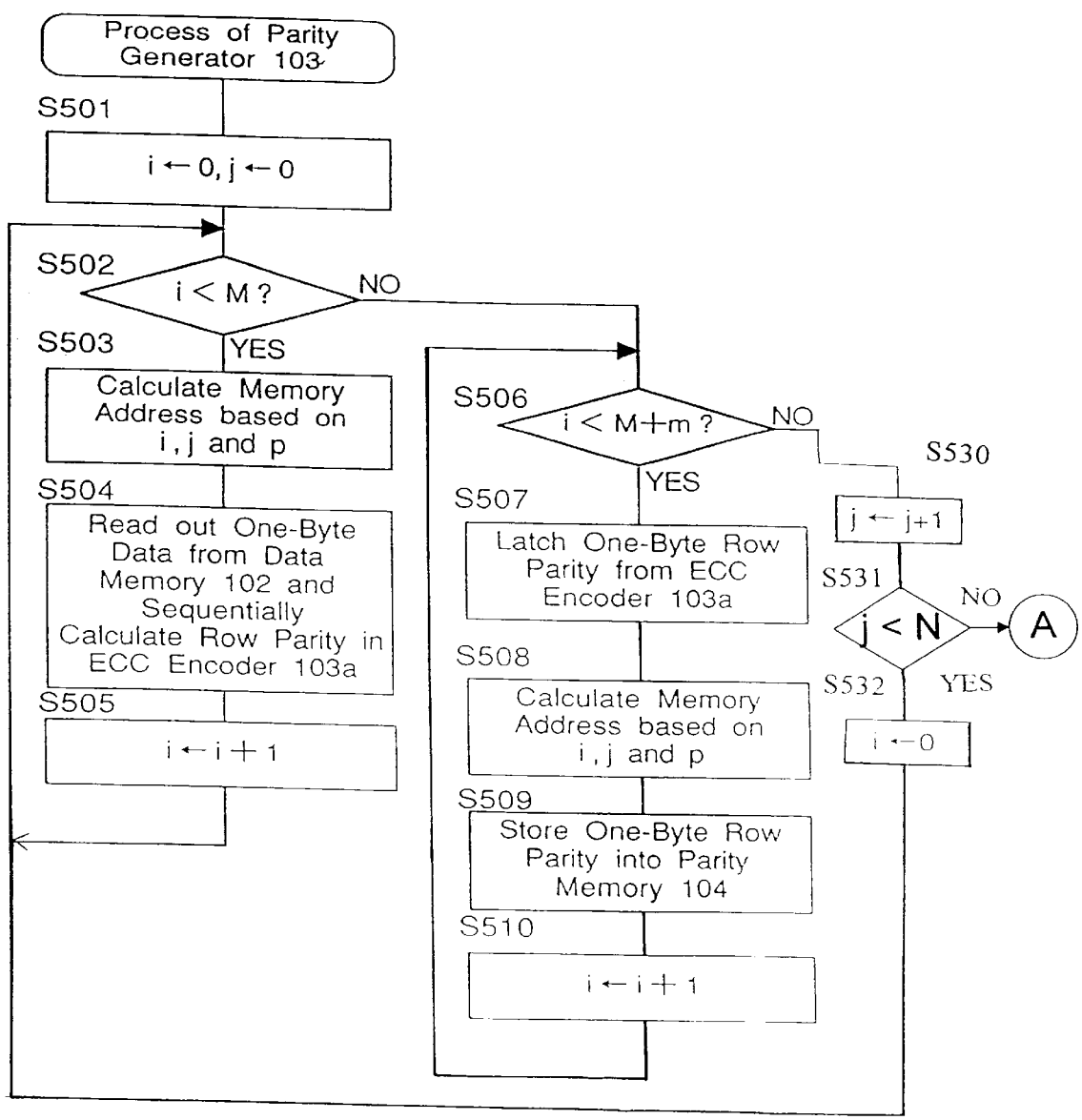
FIG. 19 is a flowchart showing a first part of a process of the parity generator shown in FIG. 10, according to a fourth embodiment of the present invention.
Figure 20:
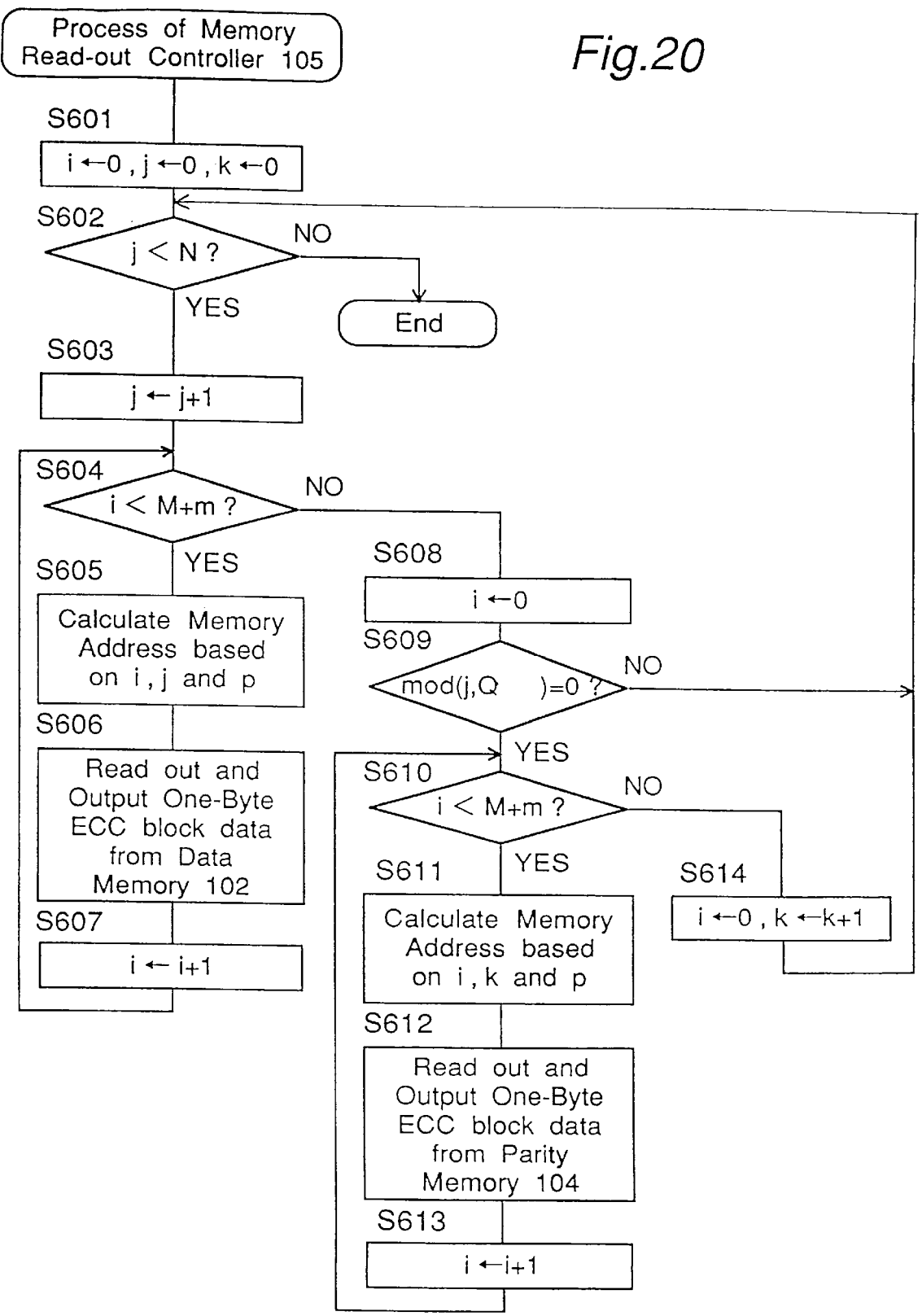
FIG. 20 is a flowchart showing a process of the memory read-out controller shown in FIG. 10, according to the fourth embodiment.

FIGS. 19 and 20 illustrate a fourth preferred embodiment of the second preferred embodiment.

FIG. 19 is a variation of the operations illustrated in FIG. 13 that are performed by parity generator 103. Similarly, FIG. 20 is a variation of the operations illustrated in FIG. 15 that are performed by the memory readout controller 105. Accordingly, the following discussion will be limited to the operations that differ from the second preferred embodiment.

The process of the parity generator 103 in the fourth preferred embodiment that differs from the second preferred embodiment will now be described. As illustrated in FIG. 19, step S506 is executed when the determination at step S502 is negative, and after the execution of step S510. In step S506, a determination is made as to whether the column number i is less than the sum of the column M and row parity m. If the determination is affirmative, the process proceeds to step S507, as in the second preferred embodiment. However, if the determination is negative, the process proceeds to execute steps S530, S531 and S532.

In step S530, the row number j is incremented by 1. Thereafter, the row number j is compared to the row N in step S531. When the row number j is less than the row N, the process proceeds to step S532, in order to reset the column number i to 0, before returning to step S502.

On the other hand, when it is determined (in step S531) that the row N is larger than or equal to the row number j, the process proceeds to step S511, illustrated in FIG. 14, in order to execute steps S511 to S523.

According to this embodiment, when the information data of one row or frame stored in the data memory 102 is read out by repeatedly reading out one-byte data from the data memory 102 and one row parity 24 of ten bytes for one frame is calculated in steps S501 to S505, the one row parity 24 of ten bytes for one frame is stored in the position of the row parity 24 of the parity memory 104 in steps S506 to S510. This procedure is repeated on every row through steps S530 to S532. Thereafter, processing of the fourth preferred embodiments proceeds as illustrated in FIG. 14.

Specifically, data in the column direction is read out by repeatedly reading out one-byte data from the data memory 102 and sixteen-byte parity symbols on the column in the column parities 23a or 23b, or the last row parity 24-13 of each sector 22 are calculated in steps S511 to S515. Thereafter, the parity symbols of the column parities 23a or 23b, or the last row parity 24-13 of each sector 22 are stored in the position of the column parities of the parity memory 104 in steps S516 to S520. This procedure is repeated on every column through steps S521 to S523.

The process of the memory read-out controller in the fourth preferred embodiment that differs from the second preferred embodiment will now be described. As illustrated in FIG. 20, data of one row (or frame) including the row parity 24 is sequentially read out from its uppermost row (or frame), and is transmitted to the transmitter 106 (see FIG. 10) in steps S601 to S607. One row parity frame or the last frame including the column parities 23a and 23b, and the row parity 24-13 is read out every time Q data frames are read out in steps S608 to S614. Thus, frames 21-13 of the column parities 23a and 23b are dispersedly transmitted from the transmitter 106.

In this regard, when it is determined at step S609 that mod(j,Q) is not equal to 0, processing returns to step S602. Similarly, after step S614 is executed, processing returns to step S602. Thus, the process cycles through steps S602 to S614 until the row number j is equal to or larger than row N.

Other embodiments

The method for arranging the parity of the ECC of the present invention has been described based on the preferred embodiments thereof, however, the present invention is of course not limited to those preferred embodiments. The following other embodiments may be provided.

In the first preferred embodiment, the column parity comprised of 16 bytes is arranged dispersedly one byte by one byte. However, the present invention is not limited to such numerical specifications. For example, there may be adopted a method for dispersedly arranging a column parity comprised of 48 bytes three bytes by three bytes.

In the second preferred embodiment, the parity generator 103 and the memory read-out controller 105 are operated after the information data of one block has been entirely inputted to the memory write controller 101. However, the present invention is not limited to such a sequence. For example, just after the memory write controller 101 has obtained the information data of one row, the parity generator 103 may calculate the row parity of the information data.

In the above-mentioned preferred embodiments, the optical disk is used as a recording medium, however, the present invention is not limited to this. The present invention can be applied to the other kind of recording medium, such as a magneto-optical disk, an optical disk, a magnetic disk, a compact disk, a magnetic tape, a semiconductor memory, or the like.

In the above-mentioned preferred embodiments, the telephone line 4000 is used, however, the present invention is not limited to this. The other kind of communication line can be used such as an ISDN (Integrated Services Digital Network) line, a packet exchange network line, an ATM (Asynchronous Transfer Mode) communication line, a Frame Relay communication line, or the like.

In the above-mentioned preferred embodiments, the parity of the Reed-Solomon code of the forward error correction method is used as the ECC, however, the present invention is not limited this. For example, a block code such as a Hamming code, an extended Hamming code, a BCH (Bose-Chau-dri-Hockengem) code, a Fire code or the like may be used as the ECC.

In the above-mentioned preferred embodiments, the data structure shown in FIG. 4 is used, however, the present invention is not limited to this. A data structure similar to that shown in FIG. 4 may be used in which the sector addresses 50 are arranged at each sector so that the sector addresses 50 can be detected at a predetermined constant time interval.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A data transmission system for transmitting information data with a parity of an error correcting code for correcting an error in said information data, comprising a data transmitter and a data receiver, wherein said data transmitter comprises:
a first storage device that stores information data to be transmitted;
a second storage device that stores a parity of an error correcting code;

a write control device that writes input information data to be transmitted to said first storage device;

a parity generating device that generates a parity to form an error correcting code word of an error correcting code to correct an error of said information data using a predetermined error correcting coding method in response to said information data stored in said first storage device, and writing the parity to said second storage device;

a transmitting device that transmits said information data stored in said first storage device and said parity stored in said second storage device; and a read-out control device that controls said transmitting device to transmit said information data stored in said first storage device and said parity stored in said second storage device, so that each data component of said information data, obtained by dividing said information data of one data block area into a plurality of data components, and each parity component of said parity, obtained by dividing said parity of one block area into a plurality of parity components, are transmitted at intervals of each sector having a sector address, so that said plurality of parity components are dispersedly arranged in one block to be transmitted, said sector being defined as a data area obtained by dividing one data block area of a predetermined data amount into a plurality of sectors, each having an identical data amount, and wherein said data receiver comprises:

a receiving device that receives each data component of said information data and each parity component of said parity transmitted at intervals of each sector by said transmitting device;

a data extracting device that extracts said information data of one block area by combining a plurality of data components received by said receiving device;

a parity extracting device that extracts said parity of one block area by combining a plurality of parity components received by said receiving device; and an error correcting device that corrects an error in said information data of one block area extracted by said data extracting device, using a predetermined error correcting decoding method, based on said parity of one block area extracted by said parity extracting device, and outputting an error-corrected information data, wherein the parity includes a row parity and a column parity, and each sector is comprised of a plurality of frames, and wherein said read-out control device controls said transmitting device to transmit the row parity at the tail of each frame after each data component, and the column parity in the last frame of each sector.

2. A data transmitter for transmitting information data with a parity of an error correcting code for correcting an error in said information data, comprising:

a first storage device that stores information data to be transmitted;

a second storage device that stores a parity of an error correcting code;

a write control device that writes input information data to be transmitted to said first storage device;

a parity generating device that generates a parity to form an error correcting code word of an error correcting code that corrects an error of said information data using a predetermined error correcting coding method in response to said information data stored in said first storage device, and writing the parity to said second storage device;

a transmitting device that transmits information data stored in said first storage device said parity stored in said second storage device; and a read-out control device that controls said transmitting device to transmit said information data stored in said first storage device and said parity stored in said second storage device so that each data component of said information data, obtained by dividing said information data of one data block area into a plurality of data components, and each parity component of said parity, obtained by dividing said parity of one block area into a plurality of parity components, are transmitted at intervals of each sector having a sector address, so that said plurality of parity components are dispersedly arranged in one block to be transmitted, said sector being defined as a data area obtained by dividing one data block area of a predetermined data amount into a plurality of sectors, each having an identical data amount, wherein the parity includes a row parity and a column parity, and each sector is comprised of a plurality of frames, and wherein said read-out control device controls said transmitting device to transmit the row parity at the tail of each frame after each data component, and the column parity in the last frame of each sector.

3. A data recording and reproducing apparatus for recording information data with a parity of an error correcting code for correcting an error in said information data into a recording medium, and reproducing said information data with said parity from said recording medium, comprising a data recorder and a data reproducer, wherein said data recorder comprises:

a first storage device that stores information data to be recorded;

a second storage device that stores a parity of an error correcting code;

a write control device that writes input information data to be recorded into said first storage device;

a parity generating device that generates a parity to form an error correcting code word of an error correcting code to correct an error of said information data using a predetermined error correcting coding method in response to said information data stored in said first storage device, and writing said parity into said second storage device;

a recording device that records, to said recording medium, said information data, stored in said first storage device, and said parity, stored in said second storage device; and a read-out control device that controls said recording device to record said information data stored in said first storage device and said parity stored in said second storage device so that each data component of said information data, obtained by dividing information data of one data block area into a plurality of data components, and each parity component of said parity, obtained by dividing said parity of one block area into a plurality of parity components, are recorded at intervals of each sector having a sector address, so that said plurality of parity components are dispersedly arranged in one block to be transmitted, said sector being defined as a data area obtained by dividing one data block area of a predetermined data amount into a plurality of sectors each having an identical data amount, wherein data reproducer comprises:

a reproducing device that reproduces each data component of said information data and each parity component of said parity which are recorded at intervals of each sector in said recording medium;

a data extracting device that extracts information data of one block area by combining a plurality of data components reproduced by said reproducing device;

a parity extracting device that extracts said parity of one block area by combining a plurality of parity components reproduced by said reproducing device; and an error correcting device that corrects an error in said information data of one block area extracted by said data extracting device, using a predetermined error correcting decoding method, based on said parity of one block area extracted by said parity extracting device, and outputting an error-corrected information data, wherein the parity includes a row parity and a column parity, and each sector is comprised of a plurality of frames, and wherein said read-out control device controls said recording device to record the row parity at the tail of each frame after each data component, and the column parity in the last frame of each sector.

4. A data recorder for recording information data with a parity of an error correcting code for correcting an error in said information data into a recording medium, comprising:

a first storage device that stores information data to be recorded;

a second storage device that stores a parity of an error correcting code;

a write control device that writes input information data to be recorded to said first storage device;

a parity generating device that generates a parity to form an error correcting word of an error correcting code to correct an error of said information data using a predetermined error correcting coding method in response to said information data stored in said first storage device, and writing said parity to said second storage device;

a recording device that records, to said recording medium, said information data stored in said first storage device and said parity stored in said second storage device; and a read-out control device that controls said recording device to record said information data stored in said first storage device and said parity stored in said second storage device, so that each data component of said information data, obtained by dividing said information data of one data block area into a plurality of data components, and each parity component of said parity, obtained by dividing said parity of one block area into a plurality of parity components, are recorded at intervals of each sector having a sector address, said sector being defined as an data area obtained by dividing one data block area of a predetermined data amount into a plurality of sectors each having an identical data amount, wherein the parity is dispersedly arranged in each sector, wherein the parity includes a row parity and a column parity, and each sector is comprised of a plurality of frames, and wherein said read-out control device controls said recording device to record the row parity at the tail of each frame after each data component, and the column parity in the last frame of each sector.

5. A method for arranging a parity of an error correcting code for correcting an error in an information data, in a recording medium, comprising:

arranging the information data and a parity so that each data component of the information data, obtained by dividing the information data of one data block area into a plurality of data components, and each parity component of the parity, obtained by dividing the parity of one block area into a plurality of parity components, are recorded at intervals of each sector having a sector address such that the parity is dispersedly arranged in each sector, the sector being defined as an data area obtained by dividing one data block area of a predetermined data amount into a plurality of sectors, each having an identical data amount, wherein the parity includes a row parity and a column parity, each sector comprising a plurality of frames, and wherein the arranging of the information data and the parity comprises arranging the row parity at a tail of each frame after each data component, and arranging a column parity in a last frame of each sector.

6. A method for transmitting information data with a parity of an error correcting code for correcting an error in the information data, comprising:

writing input information data to be transmitted into a first storage device;

generating a parity to form an error correcting code word of an error correcting code to correct an error of the information data using a predetermined error correcting code method in response to the information data stored in said first storage device, and writing the parity into a second storage device;

transmitting the information data, stored in the first storage device, and the parity, stored in the second storage device; and controlling the transmitting of the information data and the parity so that each data component of the information data, obtained by dividing the information data of one data block area into a plurality of data components, and each parity component of the parity, obtained by dividing the parity of one block area into a plurality of parity components, are transmitted at intervals of each sector having a sector address such that the parity is dispersedly arranged in each sector, the sector being defined as a data area obtained by dividing one data block area of a predetermined data amount into a plurality of sectors, each sector having an identical data amount, wherein the parity includes a row parity and a column parity, each sector comprising a plurality of frames, and wherein the controlling of the transmitting of information data and the parity comprises controlling a transmission of the row parity to be at a tail of each frame after each data component, and controlling a transmission of a column parity to be in a last frame of each sector.

7. A method for recording information data with a parity of an error correcting code for correcting an error in the information data recorded to a recording medium, comprising:

writing input information data, to be recorded, to a first storage device;

generating a parity to form an error correcting code word of an error correcting code to correct an error of the information data using a predetermined error correcting coding method in response to the information data stored in the first storage device, and writing the parity to a second storage device;

recording the information data, stored in the first storage device, and the parity, stored in the second storage device, to the recording medium; and controlling the recording of the information data and the parity so that each data component of the information data, obtained by dividing the information data of one data block area into a plurality of data components, and each parity component of the parity, obtained by dividing the parity of one block area into a plurality of parity components, are recorded at intervals of each sector having a sector address such that the parity is dispersedly arranged, the sector being defined as a data area obtained by dividing one data block area of a predetermined data amount into a plurality of sectors, each sector having an identical data amount, wherein the parity includes a row parity and a column parity, each sector comprising a plurality of frames, and wherein the controlling of the recording of the information data and the parity comprises controlling a recording of the row parity to be at a tail of each frame after each data component, and controlling a recording of a column parity to be in a last frame of each sector.

* * * * *